(12) United States Patent
Frisbie et al.

(10) Patent No.: US 7,999,020 B2
(45) Date of Patent: Aug. 16, 2011

(54) ION GELS AND ELECTRONIC DEVICES UTILIZING ION GELS

(75) Inventors: C. Daniel Frisbie, Mahtomedi, MN (US); Timothy P. Lodge, Minneapolis, MN (US)

(73) Assignee: Regents of the University of Minnesota, Saint Paul, MN (US)

( * ) Notice: Subject to any disclaimer, the term of this patent is extended or adjusted under 35 U.S.C. 154(b) by 869 days.

(21) Appl. No.: 11/947,586

(22) Filed: Nov. 29, 2007

(65) Prior Publication Data

US 2008/0191200 A1    Aug. 14, 2008

Related U.S. Application Data

(60) Provisional application No. 60/900,184, filed on Feb. 8, 2007, provisional application No. 60/921,995, filed on Apr. 5, 2007, provisional application No. 60/927,220, filed on May 2, 2007, provisional application No. 60/931,262, filed on May 22, 2007.

(51) Int. Cl.
*C08K 5/34* (2006.01)
*H01L 29/08* (2006.01)

(52) U.S. Cl. .......................................... 524/105; 257/40

(58) Field of Classification Search .................... 524/105
See application file for complete search history.

(56) References Cited

U.S. PATENT DOCUMENTS

| | | | |
|---|---|---|---|
| 2003/0111670 A1 | 6/2003 | Misra et al. | |
| 2005/0029610 A1 | 2/2005 | Nishikitani et al. | |
| 2005/0035333 A1 | 2/2005 | Gerlach | |
| 2005/0069780 A1* | 3/2005 | Kinouchi et al. | 429/317 |
| 2006/0122331 A1* | 6/2006 | Vanspeybroeck et al. | 525/191 |
| 2007/0009582 A1* | 1/2007 | Madsen et al. | 424/445 |

FOREIGN PATENT DOCUMENTS

| | | |
|---|---|---|
| WO | WO 2007/015010 A1 | 2/2007 |
| WO | WO 2007/113236 A1 | 10/2007 |

OTHER PUBLICATIONS

Ueki et al., Chemistry Letters, vol. 35, No. 8, 964-965, Jul. 2006.*
The Reply to Written Opinion for Corresponding PCT Application No. PCT/US07/024579 submitted to the PCT Office on Feb. 6, 2009 (39 pages).
J.A. Laurer et al., "Thermoplastic Elastomer Gels. I. Effects of Composition and Processing on Morphology and Gel Behavior," Journal of Polymer Science: Part B: Polymer Physics, vol. 36, pp. 2379-2391, 1998.
A, Kelarakis et al., "Aqueous Miceller Solutions of a Triblock Copolymer of Ethylene Oxide and 1,2-Butylene Oxide, $B_{12}E_{114}B_{12}$. Scaling the Viscoelasticity of Fluid and Gel," Phys. Chem. Chem. Phys., pp. 2628-2634, 2003.
S. Seki et al., "Distinct Difference in Ionic Transport Behaviour in Polymer Electrolytes Depending on the Matrix Polymers and Incorporated Salts," J. Phys. Chem. B., vol. 109, No. 9, pp. 3886-3892, 2005.
N.M.P.S. Ricardo et al., Gelation of Concentrated Micellar Solutions of a Triblock Copolymer of Ethylene Oxide and Styrene Oxide, $S_5E_{45}S_5$, Lanmuir, vol. 20, pp. 4272-4278, 2004.
T. Sato et al., "Thermoreversible Physical Gelation of Block Copolymers in a Selective Solvent," Macromolecules, vol. 33, pp. 1686-1691, 2000.
P.L. Drzal, "Origins of Mechanical Strength and Elasticity in Thermally Reversible, Acrylic Triblock Copolymer Gels," Macromolecules, vol. 36, pp. 2000-2008, 2003.
K.A. Aamer, "Rheological Studies of PLLA-PEO-PLLA Triblock Copolymer Hydrogels," Biomaterials, vol. 25, pp. 1087-1093, 2004.
Y. He et al., "Self-Assembly of Block Copolymer Micelles in an Ionic Liquid," J. Am. Chem. Soc., vol. 128, pp. 2745-2750, 2006.
T. Kawauchi et al., "Stereocomplex Formation of Isotactic and Syndiotactic Poly(methyl methacrylate)s in Ionic Liquids Leading to Thermoreversible Ion Gels," Macromolecules, vol. 38, pp. 9155-9160, 2005.
H. Tang et al., "Atom Transfer Radical Polymerization of Styrenic Ionic Liquid Monomers and Carbon Dioxide Absorption of the Polymerized Ionic Liquids," Journal of Polymer Science: Part A: Polymer Chemistry, vol. 43, pp. 1432-1443, 2005.
S. Ding et al., "Atom Transfer Radical Polymerization of Ionic Liquid 2-(1-Butylimidazolium-3-yl)ethyl Methacrylate Tetrafluoroborate," Journal of Polymer Science: Part A: Polymer Chemistry, vol. 42, pp. 5794-5801, 2004.
Joon-Ho Shin, et al., "PEO-Based Polymer Electrolytes with Ionic Liquids and Their Use in Lithium Metal-Polymer Electrolyte Batteries," Journal of the Electrochemical Society, vol. 152(5), p. A978-A938, 2005.
A.M. Christie et al., "Increasing the Conductivity of Crystalline Polymer Electrolytes," Nature, vol. 433(6), pp. 50-53, Jan. 6, 2005.
M.A. Klingshirn et al., "Gelation of Ionic Liquids Using a Cross-Linked Poly(Ethylene Glycol) Gel Matrix," Chem. Mater., vol. 16, pp. 3091-3097, 2004.
J. Lee, "Ion Gel Gated Polymer Thin-Film Transistors," J. Am. Chem. Soc., vol. 129, pp. 4532-4533, 2007.
P.G. Boswell, "Coordinative Properties of Highly Fluorinated Solvents with Amino and Ether Groups," J. Am. Chem. Soc., vol. 127, pp. 16976-16984, 2005.
H. Ohno et al., "Development of New Class of Ion Conductive Polymers Based on Ionic Liquids," Electrochimica Acta, vol. 50, pp. 255-261, 2004.
Md. Abu Bin Hasan Susan et al., "Ion Gels Prepared by in Situ Radical Polymerization of Vinyl Monomers in an Ionic Liquid and Their Characterization as Polymer Electrolytes," J. Am. Chem. Soc., vol. 127, pp. 4976-4983, 2005.
C. Zhang et al., "Raising the Conductivity of Crystalline Polymer Electrolytes by Aliovalent Doping," J. Am. Chem. Soc., vol. 127, pp. 18305-18308, 2005.
C. Tiyapiboonchaiya et al., "The Zwitterion Effect in High-Conductivity Polyelectrolyte Materials," Nature Material, vol. 3, pp. 29-32, Jan. 2004.

(Continued)

*Primary Examiner* — Ling-Siu Choi
*Assistant Examiner* — Hui Chin
(74) *Attorney, Agent, or Firm* — Shumaker & Sieffert, P.A.

(57) ABSTRACT

An ion gel including an ionic liquid and a block copolymer. The block copolymer includes at least three blocks, and the block copolymer forms a self-assembled ion gel in the ionic liquid. Also, thin film transistors including an ion gel insulator layer, capacitors including an ion gel insulator layer, integrated circuits including transistors including an ion gel insulator layer, and methods for forming each of these devices are described.

83 Claims, 27 Drawing Sheets

OTHER PUBLICATIONS

Pierre-Jean Alarco et al., "The Plastic-Crystalline Phase of Succinonitrile as a Universal Matrix for Solid-State Ionic Conductors," Nature Materials, vol. 3, pp. 476-481, Jul. 2004.

E. Staunton et al., "Structure and Conductivity of the Crystalline Polymer Electrolyte β-$PEO_6$:$LiAsF_6$," J. Am. Chem. Soc., vol. 127, pp. 12176-12177, 2005.

D.R. MacFarlane et al., "Lithium-Doped Plastic Crystal Electrolytes Exhibiting Fast Ion Conduction for Secondary Batteries," Nature, vol. 402, pp. 792-794, Dec. 1999.

Z. Gadjourova et al., "Ionic Conductivity in Crystalline Polymer Electrolytes," Nature, vol. 412, pp. 520-523, Aug. 2001.

Y.G. Takei et al., "Temperature-Responsive Bioconjugates. 2. Molecular Design for Temperature-Modulated Bioseparations," Bioconjugate Chem., vol. 4, pp. 341-346, 1993.

T. Ueki et al., "Lower Critical Solution Temperature Behavior of Linear Polymers in Ionic Liquids and the Corresponding Volume Phase Transition of Polymer Gels," Langmuir, vol. 23, pp. 988-990, 2007.

J. Tang et al., "Poly(ionic liquid)s: A New Material with Enhanced and Fast $CO_2$ Absorption," Chem. Commun., pp. 3325-3327, 2005.

J. Huang et al., "Reversible Physical Absorbtion of $SO_2$ by Ionic Liquids," Chem. Commun., pp. 4027-4029, 2006.

Y. Shao et al., "Long-Lifetime Polymer Light-Emitting Electrochemical Cells," Advanced Materials, vol. 19, pp. 365-370, 2007.

D. Zhou et al., "Solid State Actuators Based on Polypyrrole and Polymer-in-Ionic Liquid Electrolytes," Electrochimica Acta, vol. 48, pp. 2355-2359, 2003.

T. Fukushima et al., "Dramatic Effect of Dispersed Carbon Nanotubes on the Mechanical and Electroconductive Properties of Polymers Derived from Ionic Liquids," Small, vol. 2(4), pp. 554-560, 2006.

K. Hanabusa et al., "Specialist Gelator for Ionic Liquids," Langmuir, vol. 21, pp. 10383-10390, 2005.

R. Kawano et al., "High Performance Dye-Sensitized Solar Cells Using Ionic Liquids as Their Electrolytes," Journal of Photochemistry and Photobiology A: Chemistry, vol. 164, pp. 87-92, 2004.

H. Shobukawa et al., "Preparation and Transport Porperties of Novel Lithium Ionic Liquids," Electrochimica Acta, vol. 50, pp. 1-5, 2004.

Z. Stoeva et al., "Ionic Conductivity in the Crystalline Polymer Electrolytes $PEO_6$:$LiXF_6$, X=P, As, Sb," J. Am. Chem. Soc., vol. 125, pp. 4619-4626, 2003.

B. Singh et al., "Polymer Electrolytes Based on Room Temperature Ionic Liquid: 2,3-Dimethyl-l-Octylimidazolium Triflate," J. Phys. Chem. B, vol. 109, pp. 16539-16543, 2005.

A. Lewandowski et al., "New Composite Solid Electrolytes Based on a Polymer and Ionic Liquids," Solid State Ionics, vol. 169, pp. 21-24, 2004.

B. Akle et al., "High-Strain Ionomeric-Ionic Liquid Electroactive Actuators," Sensors and Actuators, pp. 173-181, 2006.

J. Shin et al., "Ionic Liquids to the Rescue? Overcoming the Ionic Conductivity Limitations of Polymer Electrolytes," Electrochemistry Communications, pp. 1016-1020, 2003.

T. Ueki et al., "Upper Critical Solution Temperature Behavior of Poly(N-Isopropylacrylamide) in an Ionic Liquid and Preparation of Thermo-Sensitive Nonvolatile Gels," Chemistry Letters, vol. 35, No. 8, pp. 964-965, 2006.

A. Noda et al., "Bronsted Acid-Base Ionic Liquids as Proton-Conducting Nonaqueous Electrolytes," Journal of Phys. Chem. B, pp. 4024-4033, 2003.

A. Christie et al., "Increasing the Conductivity of Crystalline Polymer Electrolytes," Nature, vol. 433, pp. 50-53, Jan. 6, 2005.

The Notification of Transmittal of the International Preliminary Report on Patentability for corresponding PCT Application No. PCT/US07/024579 mailed Jun. 12, 2009. (17 pages).

The Notification of Transmittal of the International Search Report and Written Opinion for corresponding PCT Application No. PCT/US07/024579 mailed Nov. 6, 2008. (17 pages).

* cited by examiner

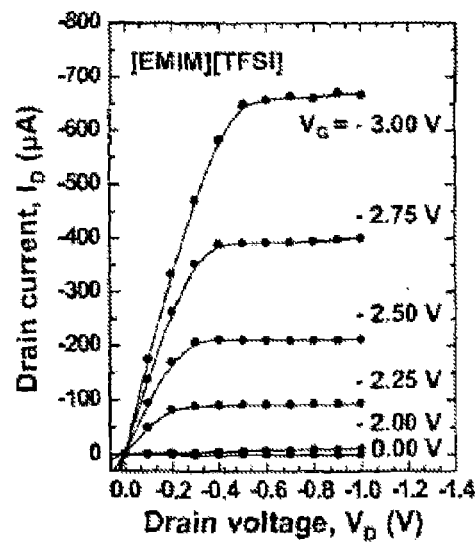
FIG. 22A
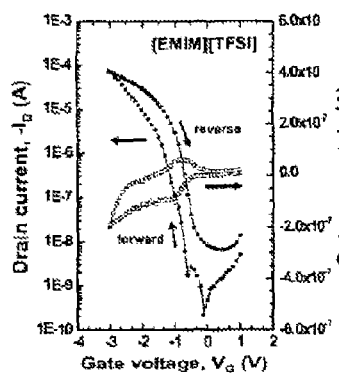 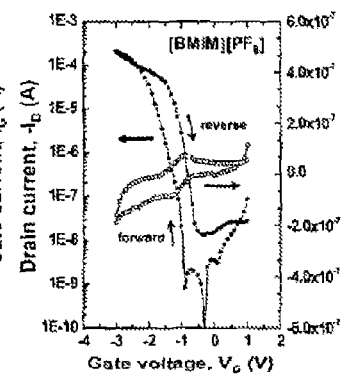 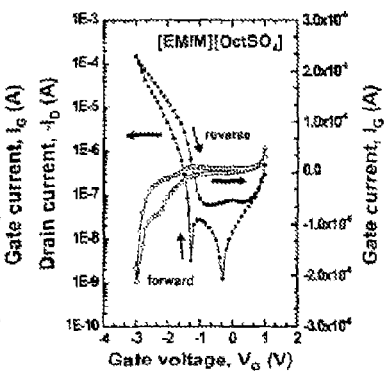
FIG. 22B   FIG. 22C   FIG. 22D

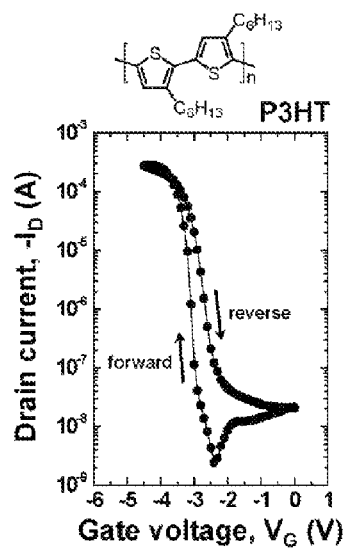
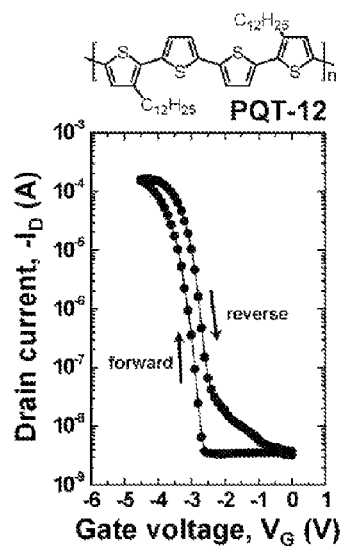
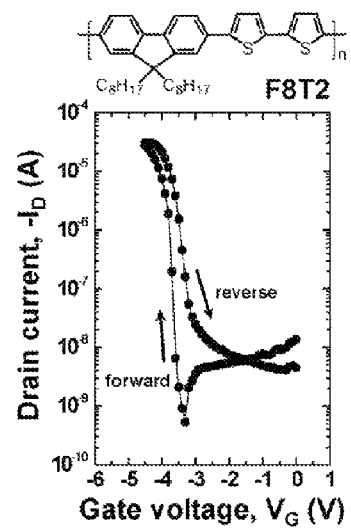
FIG. 24A      FIG. 24B      FIG. 24C

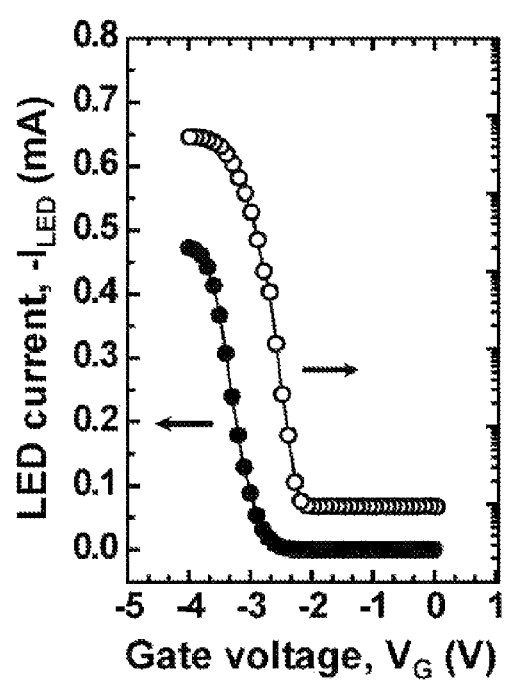
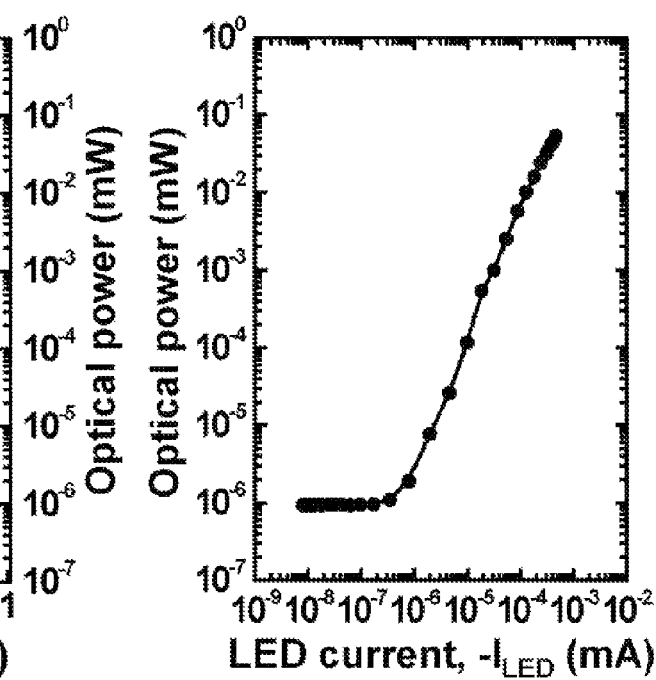
FIG. 25A          FIG. 25B

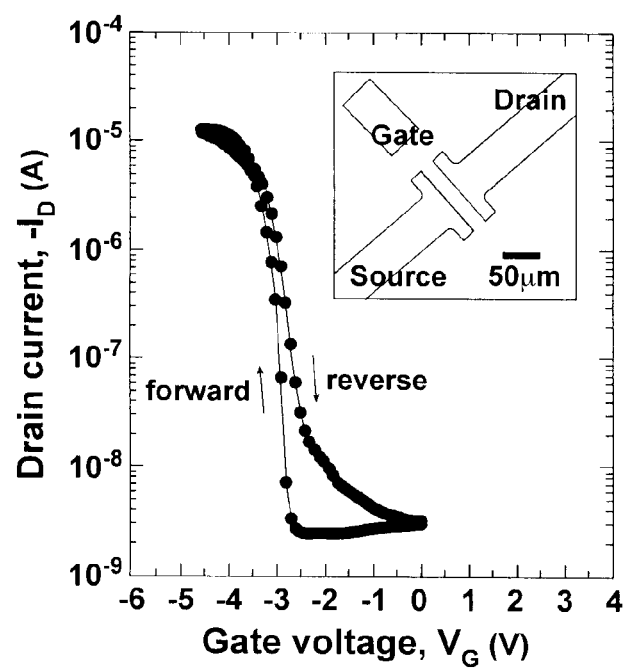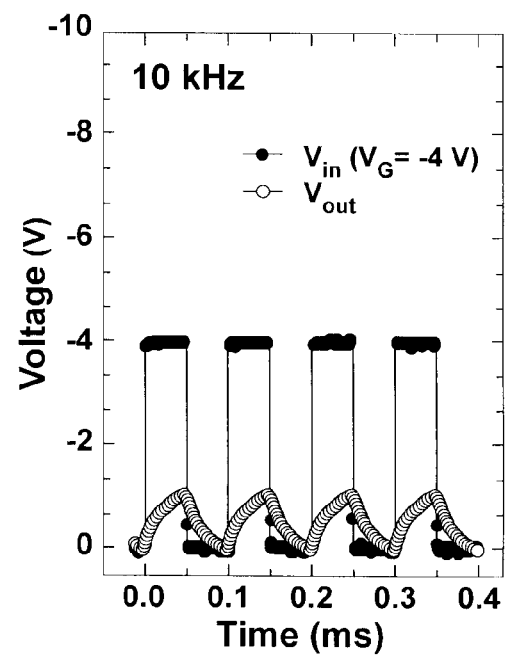
FIG. 26A  FIG. 26B

US 7,999,020 B2

ION GELS AND ELECTRONIC DEVICES UTILIZING ION GELS

This application claims the benefit of U.S. Provisional Application No. 60/900,184, entitled "GATE INSULATOR MATERIAL," filed on Feb. 8, 2007, U.S. Provisional Application No. 60/921,995, entitled "GATE INSULATOR MATERIAL," filed on Apr. 5, 2007, U.S. Provisional Application No. 60/927,220, entitled "GATE INSULATOR MATERIAL," filed on May 2, 2007, and U.S. Provisional Application No. 60/931,262, entitled "ION GELS BY SELF-ASSEMBLY OF A TRIBLOCK COPOLYMER IN AN IONIC LIQUID," filed on May 22, 2007. The entire content of each of these Applications is incorporated herein by reference.

TECHNICAL FIELD

The invention relates to ion gels and electronic devices using ion gels as electronic insulators.

BACKGROUND

Field effect transistors (FETs) that are based on inorganic materials such as silicon (Si) are well-known and widely used. A typical FET device includes several layers, such as a substrate layer, a semi-conductor layer, source and drain electrodes connected to the semiconductor layer, a gate electrode, and an insulator layer between the gate electrode and the semiconductor layer. Applying a potential to the gate electrode results in charge carrier accumulation or depletion at the interface of the semiconductor layer and insulator layer, depending on the applied gate voltage and the semiconductor material type. When charge carriers are accumulated at the interface, a conductive channel then formed between the source and the drain electrodes and current flows when a potential is applied to the drain electrode. On the other hand, when charge carriers are depleted at the interface, current cannot easily flow between the source and drain, and the transistor is considered to be "off."

There has been a growing interest in developing FETs using organic materials to produce an organic thin film transistor (OTFT). Mobile electronic applications usually use a battery as a power source and need small power consumption electronic systems to prolong battery life. However, OTFTs developed thus far need high driving voltages, which causes large power consumption and undesirably short battery life. This is at least partially due to the limited capacitance value (typically, $C_i < 100$ nF/cm$^2$) of the dielectric materials in OTFTs. Much work has been done to obtain large capacitances of dielectrics for OTFTs, including employing high-dielectric-constant (high-k) metal oxides such as $Ta_2O_3$, $TiO_2$, and the like, and using ultra-thin polymer or self-assembled monolayer (SAM) dielectrics. However these materials still have limited capacitance values ($C_i < 1$ µF/cm$^2$).

Additionally, polymer electrolytes have been studied as an alternative insulating layer because of their high capacitances, typically greater than about 10 µF/cm$^2$. Devices based on polymer electrolytes can be operated at low voltages with much higher output currents. However, devices based on polymer electrolytes are limited in terms of transistor switching frequency, and typically have a maximum operating frequency of less than about 50 Hz. While not wishing to be bound by any specific theory, it is believed that this low switching frequency results from the very low ionic conductivity (on the order of $10^{-4}$ to $10^{-5}$ S/cm) of polymer electrolytes, which limits polarization frequency, and thus switching speed.

SUMMARY

Thus, it is recognized that a need exists for a high capacitance dielectric that has a higher (greater than about 100 Hz) switching speed. More specifically, a high capacitance dielectric for use in OTFTs is desired.

In general, this disclosure is directed to ion gels that make desirable dielectrics for the insulator layer of a thin film transistor, and to electronic devices using the ion gels.

The ion gels of the present disclosure may be formed by self-assembly of a triblock or greater copolymer (e.g., triblock, tetrablock, pentablock, or greater) in an ionic liquid. At least the end blocks of the copolymer are preferably substantially insoluble in the ionic liquid at the use temperature (e.g., room temperature). At least one of the middle blocks is preferably compatible with (i.e., is dissolved by) the ionic liquid. Thus, the triblock or greater copolymer may self-assemble into a polymer network by forming interconnected micelles in the ionic liquid.

In one aspect, the disclosure is directed to an ion gel including an ionic liquid and a block copolymer. The block copolymer forms a self-assembled ion gel in the ionic liquid.

In various embodiments, the block copolymer may include at least two A blocks and a B block, and the blocks may be in an A-B-A arrangement. In other embodiments, the block copolymer may include either three A blocks and two B blocks in an A-B-A-B-A arrangement or two A blocks, one B block, and two C blocks in an A-C-B-C-A arrangement.

In some embodiments, the A block may include a low polarity polymer that is substantially insoluble in the ionic liquid, and the A block may be at least partially glassy at room temperature. In some preferred embodiments, the B block is compatible with the ionic liquid.

In certain embodiments, the A block may include at least one of polystyrene and poly(N-isopropyl acrylamide), and the B block may include at least one of poly(methylmethacrylate), poly(ethyl acrylate), and poly(ethylene oxide). In some preferred embodiments, the block copolymer may include poly(styrene-block-ethylene oxide-block-styrene), or the polymer may include poly(N-isopropyl acrylamide-block-ethylene oxide-block-N-isopropyl acrylamide).

In some embodiments, the ionic liquid is selected from the group consisting of [BMIM][PF$_6$], [EMIM][TFSI], and [EMIM][OctSO$_4$].

In certain embodiments, the self-assembled ion gel is thermoreversible.

In some embodiments, the ion gel may include about 4 wt. % to about 10 wt. % polymer.

In another aspect, the disclosure is directed to a method of forming an ion gel including forming a block copolymer comprising at least three blocks, and depositing the block copolymer in an ionic liquid, where the block copolymer forms a self-assembled polymer gel in the ionic liquid.

In some embodiments, the ion gel is thermoreversible, and the method further includes raising the temperature of the ion gel above the upper critical solution temperature to form a liquid solution, processing the liquid solution, and cooling the liquid solution to below the upper critical solution temperature to reform the self-assembled polymer gel.

In yet another aspect, the disclosure is directed to a thin film transistor including a semiconductor layer, a source electrode; a drain electrode; a gate electrode; and an ion gel layer forming an insulator layer between the gate electrode and the semiconductor layer.

In some embodiments, the ion gel layer includes an ionic liquid and a block copolymer including at least three blocks, and the block copolymer forms a self-assembled polymer gel in the ionic liquid.

In some embodiments, the gate electrode may be offset from the source electrode and drain electrode. In certain further embodiments, the gate electrode is substantially coplanar with the source electrode and the drain electrode.

In another aspect, the disclosure is directed to a method including depositing a layer of ion gel to form an insulator between a gate electrode and a semiconductor layer.

In one embodiment, the method further includes heating an ion gel above an upper critical solution temperature to form a liquid, depositing a layer of the liquid, and cooling the liquid below the upper critical solution temperature to form the layer of the ion gel between the gate electrode and the semiconductor layer.

In another embodiment, the method further includes providing a substrate. The semiconductor layer is deposited on the substrate, and a source electrode and a drain electrode are deposited on the semiconductor layer. The layer of ion gel is deposited on the semiconductor layer and the source electrode and the drain electrode to form the insulator layer. The gate electrode is deposited on the layer of ion gel.

In yet another embodiment, the method further includes providing a substrate. A source electrode and a drain electrode are deposited on the substrate. The semiconductor layer is deposited on the substrate and the source electrode and the drain electrode. The layer of ion gel is deposited on the semiconductor layer and the source and drain electrodes to form the insulator layer, and the gate electrode is deposited on the layer of ion gel.

In yet another embodiment, the method further includes providing a substrate, depositing the gate electrode on the substrate, depositing the layer of ion gel on the substrate and the gate electrode to form the insulator layer, depositing a source electrode and a drain electrode on the layer of ion gel, and depositing the semiconductor layer on the ion gel, the source electrode, and the drain electrode.

In certain embodiments, depositing a layer of ion gel comprises printing a layer of ion gel. In some embodiments, the semiconductor layer includes an organic semiconductor.

In yet another aspect, the disclosure is directed to a method including depositing a source electrode, a drain electrode, and a gate electrode on a substrate. A semiconductor layer is deposited over the source electrode and the drain electrode, and an ion gel layer is deposited over the semiconductor layer and the gate electrode to form an insulator layer between the gate electrode and the semiconductor layer.

In some embodiments, depositing an ion gel over the semiconductor layer and the gate electrode includes printing an ion gel over the semiconductor layer and the gate electrode. In certain embodiments, the semiconductor layer includes an organic semiconductor.

In yet another aspect, the disclosure is directed to an integrated circuit including at least one transistor, and the transistor includes an ion gel insulator layer.

In some embodiments, the integrated circuit further includes a light emitting diode.

In some embodiments, the transistor further includes a gate electrode, a source electrode, a drain electrode, and a semiconductor, wherein the ion gel insulator layer is an insulator layer between the gate electrode and the semiconductor. In certain embodiments, the gate electrode may be offset from the at least one of the source electrode and the drain electrode. In other embodiments, the gate electrode may be substantially coplanar with the source electrode and drain electrode. In yet other embodiments, the integrated circuit further includes a substrate supporting the semiconductor.

In yet another aspect, the disclosure is directed to a method including forming a plurality of transistors comprising an ion gel insulator layer, where the ion gel insulator layer forms an insulator between a gate electrode and a semiconductor layer. The method further includes electrically connecting at least one of the plurality of transistors with at least one other of the plurality of transistors to form an integrated circuit.

In one embodiment, forming a plurality of transistors includes heating an ion gel above an upper critical solution temperature to form a liquid, depositing a layer of the liquid, and cooling the liquid below the upper critical solution temperature to form the layer of the ion gel between the gate electrode and the semiconductor layer.

In another embodiment, the forming a plurality of transistors includes providing a substrate. The semiconductor layer is deposited on the substrate, and a source electrode and a drain electrode are deposited on the semiconductor layer. The layer of ion gel is deposited on the semiconductor layer and the source electrode and the drain electrode to form the insulator layer. The gate electrode is deposited on the layer of ion gel.

In yet another embodiment, forming a plurality of transistors includes providing a substrate. A source electrode and a drain electrode are deposited on the substrate. The semiconductor layer is deposited on the substrate and the source electrode and the drain electrode. The layer of ion gel is deposited on the semiconductor layer and the source and drain electrodes to form the insulator layer, and the gate electrode is deposited on the layer of ion gel.

In yet another embodiment, forming a plurality of transistors includes providing a substrate, depositing the gate electrode on the substrate, depositing the layer of ion gel on the substrate and the gate electrode to form the insulator layer, depositing a source electrode and a drain electrode on the layer of ion gel, and depositing the semiconductor layer on the ion gel, the source electrode, and the drain electrode.

In certain embodiments, depositing a layer of ion gel comprises printing a layer of ion gel. In some embodiments, the semiconductor layer includes an organic semiconductor.

In yet another aspect, the disclosure is directed to a thermoreversible ion gel including an ionic liquid and a self-assembled polymer network including a polymer. The polymer comprises at least three blocks, and the self-assembled polymer network is formed when a mixture of the ionic liquid and the polymer is below an upper critical solution temperature of the mixture. The self-assembled polymer network disassembles when the mixture is above the upper critical solution temperature of the mixture.

In some embodiments, the polymer comprises at least two A blocks and a B block. In certain embodiments, the blocks are arranged in an A-B-A arrangement.

In other embodiments, the ionic liquid is selected from the group consisting of [BMIM][$PF_6$], [EMIM][TFSI], and [EMIM][$OctSO_4$].

In some embodiments, the polymer comprises at least five blocks. In certain embodiments, the polymer includes three A blocks and two B blocks in an A-B-A-B-A arrangement or two A blocks, one B block, and two C blocks in an A-C-B-C-A arrangement.

In some preferred embodiments, the B block is compatible with the ionic liquid. In certain preferred embodiments, the A block includes poly(N-isopropyl acrylamide). In some preferred embodiments, the B block includes poly(ethylene oxide).

In some embodiments, the polymer includes poly(N-isopropyl acrylamide-block-ethylene oxide-block-N-isopropyl acrylamide). In other embodiments, the polymer includes poly(N-isopropyl acrylamide-block-styrene-block-ethylene oxide-block-styrene-block-N-isopropyl acrylamide). The thermoreversible ion gel may include about 4 wt. % to about 10 wt. % polymer in some embodiments.

In yet another aspect, the disclosure is directed to a ion gel including an ionic liquid and a block copolymer including at least five blocks, where the block copolymer forms a self-assembled ion gel in the ionic liquid.

In yet another aspect, the disclosure is directed to a capacitor including an insulator layer. The insulator layer includes an ionic liquid, and a block copolymer including at least three blocks, where the block copolymer forms a self-assembled ion gel in the ionic liquid.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 22A is a plot of drain current versus drain voltage for an exemplary IG-FET.

FIGS. 22B-D are plots of drain current versus gate voltage for three exemplary IG-FETs.

FIGS. 24A-C are plots of drain current versus gate voltage of exemplary IG-FETs utilizing three different semiconductor layers.

FIG. 25A is a plot of LED current versus gate voltage and optical power versus gate voltage for an exemplary LED circuit including an IG-FET.

FIG. 25B is a plot of optical power versus LED current for an exemplary LED circuit including an IG-FET.

FIG. 26A is a plot of drain current versus gate voltage for an exemplary LED circuit including an IG-FET.

FIG. 26B is a transient response plot for an exemplary IG-FET including an offset gate electrode.

DETAILED DESCRIPTION

The present disclosure is generally directed to ion gels, methods of forming ion gels, and electronic devices utilizing ion gels. Throughout the instant disclosure, the term ion gel is used to denote a polymeric gel including an ionic liquid and an at least triblock copolymer that has self-assembled in the ionic liquid to form a polymer network including micelles connected by polymer chains. In the present application the term self-assembled refers to a process in which substantially insoluble polymer blocks non-covalently assemble to form micelles or the like in an ionic liquid. At least some of the micelles are bridged by polymeric blocks that are compatible with the ionic liquid.

Figure 1A:
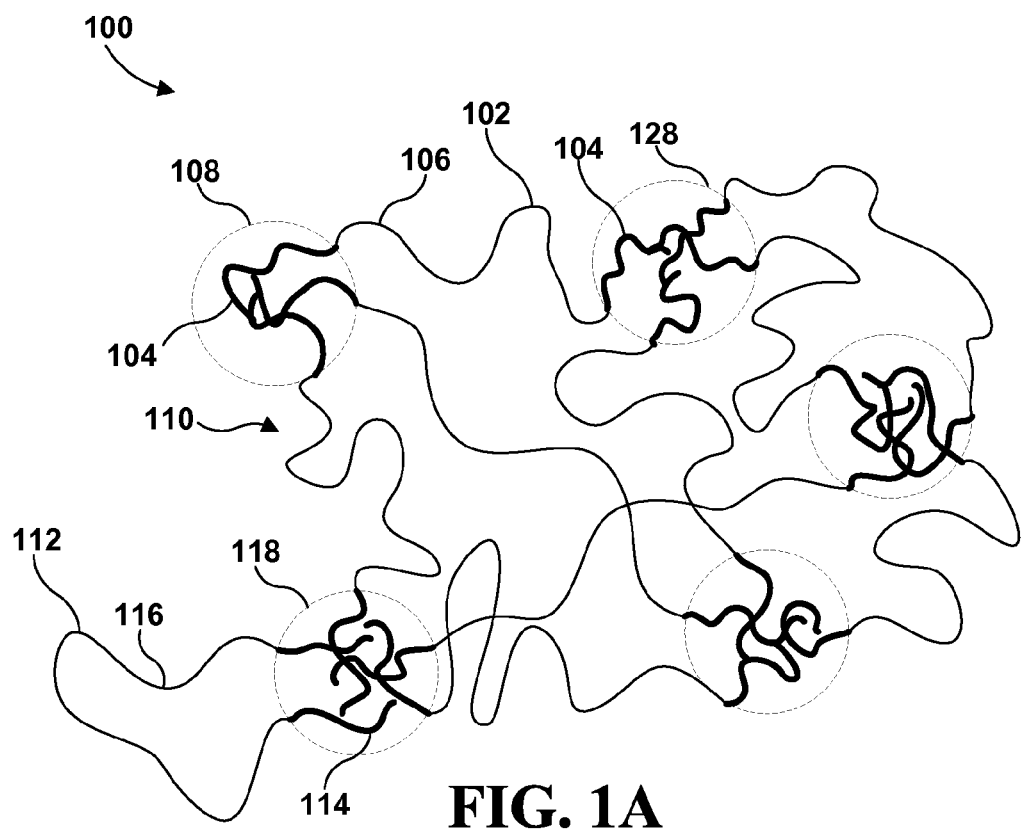
FIG. 1A is a representation of an ion gel formed by a triblock copolymer in an ionic liquid.
Figure 1B:
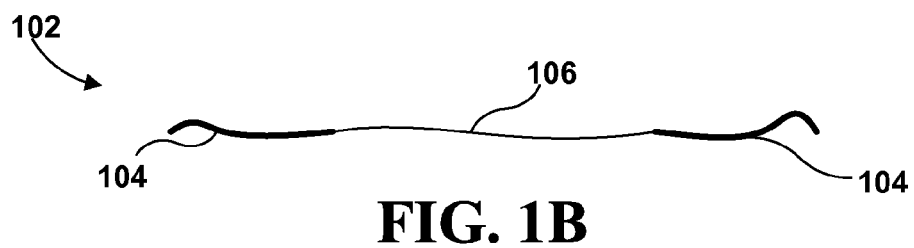
FIG. 1B is a representation of the triblock copolymer shown if FIG. 1A.

In one embodiment, as depicted in FIGS. 1A and 1B, an ion gel 100 may include triblock copolymer chains 102, 112 (collectively "copolymer chains 102") including two chemically similar A blocks 104, 114 (collectively "A blocks 104") that are substantially insoluble in the ionic liquid 110 over a specified temperature range. The copolymer chains 102 also include B blocks 106, 116 (collectively "B blocks 106") that may be compatible with (i.e., dissolvable in) the ionic liquid 110. When an amount of triblock copolymer above a critical gelation concentration (i.e., the concentration of copolymer above which a percolating network forms) is added to the ionic liquid 110, a polymer network including micelles 108, 118, 128 (collectively "micelles 108") formed by the substantially insoluble A blocks 104 and bridged by the compatible B blocks 106 is produced in the ionic liquid 110, forming an ion gel 100 comprising the triblock copolymer and the ionic liquid 110.

The interactions between the ionic liquid 110 and the A blocks 104 and B blocks 106 of the copolymer chains 102 can be considered when selecting the ionic liquid 110 and block copolymer. The ionic liquid 110 preferably dissolves the B blocks 106 and does not dissolve the A blocks 104. When this occurs, the A blocks 104 non-covalently associate and form micelles 108. At least some of the B blocks 106 form bridges between micelles (for example, micelles 108, 128), connecting A blocks 104 of the same copolymer chain 102 in different micelles 108, 128, as illustrated in FIG. 1. The bridging of the individual micelles 108, 118, 128 by the B blocks 106 imparts mechanical strength to the gel 100, and the more B blocks bridging the gaps between the micelles 108, the greater the mechanical strength of the gel 100.

Some copolymer chains 112, however, may have A blocks 114 that are located in the same micelle 118. The B block 116 of these copolymers chains 112, then, is located out of the micelle 118, but does not bridge between two micelles 108. Thus, when the two A blocks 114 are located in the same micelle 118, that copolymer chain 112 does not appreciably contribute to the strength of the ion gel 100.

Additionally, as mentioned briefly above, the B block 106 is substantially soluble in the ionic liquid 110. Solubility of the B block 106 in a given ionic liquid may be tailored by choice of the constituent monomers of the B block 106. More specifically, it is preferred that the B block 106 does not form any crystalline domains in the ionic liquid 110, which may occur if the ionic liquid 110 is not sufficiently compatible with the B block 106. Crystalline B block 106 domains may reduce the segmental dynamics of the B block 106, which may in turn reduce the mobility of the ionic liquid 110 in the ion gel 100. Reducing the mobility of the ionic liquid 110 in the ion gel 100 may undesirably reduce the ionic conductivity of the ion gel 100. Thus, it is desired that the B block 106 is compatible with the ionic liquid, so that no crystalline B block domains are formed.

In some embodiments, the B block 106 includes a polymer that has a low glass transition temperature ($T_g$). For example, a $T_g$ below the use temperature of the gel 100 may be desired, so that the B block 106 is substantially rubbery, or a viscous liquid, at the use temperature. In one preferred embodiment, the B block 106 has a $T_g$ of about 220 K (about −53° C.). A low $T_g$ may indicate fast segmental dynamics, which will then affect the mobility of the ions in the ionic liquid 110 less significantly.

The properties of the ion gel 100 may be further tailored for a particular application by selecting the molecular weight of the B block 106. As discussed above, the B block 106 forms bridges between the micelles formed by the A blocks 104. Thus, a higher molecular weight (longer) B block 106 may lead to an increased average distance between the micelles 108 formed by the self-assembled A blocks 104. One measure of the distance between the micelles is the mesh size of the gel. The larger the mesh size, the greater the average distance between adjacent micelles. It follows, then, that a longer B block 106 leads to a gel 100 with a larger mesh size, and a shorter B block 106 leads to a gel 100 with a smaller mesh size.

Preferred molecular weights of the B block 106 range from about 10,000 g/mol to about 100,000 g/mol, more preferably about 20,000 g/mol to about 50,000 g/mol. In some embodiments, a larger B block 106 leads to a smaller weight percent of copolymer required in the ion gel 100 to cause gelation.

The B block 106 also preferably includes constituent monomers that are soluble in the ionic liquid 110. In some cases, this means a B block 106 that has permanent polar functional groups or functional groups that may be polarized, including, for example, carbonyl groups, ether groups, amine groups, and the like. Some preferred B blocks 106 include poly(methylmethacrylate), poly(ethylene oxide), poly(ethyl acrylate), and the like.

The A blocks 104, on the other hand, may be chosen to be substantially insoluble in the ionic liquid 110. In some embodiments, the A blocks 104 are chosen to be substantially insoluble in the ionic liquid 110 at all temperatures experienced by the ion gel 100 (e.g., the processing temperature, use temperature, storage temperature, and the like). In other embodiments, an A block 104 is chosen that is insoluble in the ionic liquid 110 at certain temperatures below an upper critical solution temperature (UCST) of the block copolymer/ionic liquid system and is soluble in the ionic liquid 110 above the UCST of the block copolymer/ionic liquid system. The UCST is the temperature at which mixture of the block copolymer and the ionic liquid 110 changes from a micellar suspension to a molecular solution. In this way, a thermoreversible ion gel 100 may be produced.

A thermoreversible gel may be desirable in many cases. For example, thermoreversibility may allow an ion gel 100 to be processed at higher temperatures as a viscous liquid solution then cooled to a lower use temperature, where the ion gel 100 is formed. This may allow the thermoreversible gel to be used in a wide variety of processes including, for example, printing applications such as screen printing, flexographic printing, gravure prinking, inkjet printing, and the like; coating applications; and the like.

Thermoreversibility may be tailored through the choice of the constituent monomers of the A block 104, the molecular weight of the A block 104, and the choice of ionic liquid 110, and the like. For example, the more compatible the A block 104 is with the ionic liquid 110, the lower the UCST will be. Conversely, a less compatible A block 104 will increase the UCST of the block copolymer/ionic liquid 110 system. As another example, as the molecular weight (and thus length) of the A block 104 increases, the UCST is expected to also increase.

Preferred molecular weight ranges of the each A block include from about 2,000 g/mol to about 20,000 g/mol, more preferably about 5,000 g/mol to about 10,000 g/mol.

Regardless of whether or not the ion gel 100 is thermoreversible, it is typically desired that the ion gel 100 is a gel at the use temperature. As presented briefly above, the formation of a gel requires a concentration of copolymer above the critical gelation concentration. The disclosed ion gels 100 formed by self-assembly of a triblock copolymer may have a critical gelation concentration that is much lower than a gel formed by in situ polymerization of monomer into a branched homopolymer in the ionic liquid 110. For example, gels formed by in situ polymerization typically require about 10 wt. % to about 30 wt. % polymer to form a gel. In contrast, the gels of the current disclosure form self-assembled gels at less than 10 wt. % triblock copolymer, typically at about 4 wt. % to about 5 wt. % triblock copolymer. The lower concentration of copolymer in the ion gel 100 results in an ionic conductivity of the ion gel 100 that is closer to the ionic conductivity of the bulk ionic liquid 110. Thus, the lower concentration of copolymer in the ion gel may enable increased ionic conductivity when compared to ion gels including the same ionic liquid 110 formed by in situ polymerization.

The A block 104 may include any relatively nonpolar polymer. Preferred A blocks 104 include polystyrene (PS), polybutadiene, polyisoprene, polyethylene, polydimethylsiloxane, polyisobutylene, and poly(N-isopropyl acrylamide) (PNIPAm).

Preferred block copolymers include poly(styrene-block-ethylene oxide-block-styrene) (S—O—S) in a non-thermoreversible ion gel 100, and poly(N-isopropyl acrylamide-block-ethylene oxide-block-N-isopropyl acrylamide) (PNIPAm-PEO-PNIPAm).

The preferred molecular weight of the triblock copolymer is greater than about 10,000 g/mol, more preferably about 14,000 g/mol to about 140,000 g/mol, and even more preferably about 30,000 g/mol to about 70,000 g/mol.

The ion gel 100 may include any ionic liquid 110. Ionic liquids 110 may be selected to provide at least one of desired ionic conductivity, capacitance, resistance to electrical breakdown (i.e., the window between a positive and a negative applied bias over which the ionic liquid is electrically stable), and compatibility with the block copolymer system. For example, selecting an ionic liquid 110 with higher ionic conductivity may decrease the polarization response time of the gel 100 to an applied electric field. Selecting an ionic liquid 110 with higher ionic conductivity may also increase the capacitance of the ion gel 100 of a given thickness relative to an ionic liquid of the same thickness with a lower ionic conductivity.

Ionic liquids are known that vary in ionic conductivity by more than two orders of magnitude, and it is conceivable that other ionic liquids will be synthesized with smaller, and also larger, ionic conductivities. For example, the ionic conductivity of 1-ethyl-3-methylimidazolium n-octylsulfate ([EMIM][OctSO$_4$]) is about 0.66 mS/cm, and the ionic conductivity of 1,3-dimethylimidazolium fluorohydrogenate is about 110 mS/cm. Thus, the ionic conductivity of the ion gel 100 may be tailored over a large range of values simply through the selection of an appropriate ionic liquid 110.

Any ionic liquid 110 may be used in ionic gels. Examples of particularly useful ionic liquids 110 include 1-ethyl-3-methylimidazolium bis(trifluoromethylsulfonyl)imide ([EMIM][TFSI]), 1-butyl-3-methylimidazolium hexafluorophosphate ([BMIM][PF$_6$]), and 1-ethyl-3-methylimidazolium n-octylsulfate ([EMIM][OctSO$_4$]). However, any other suitable ionic liquid 110 may be used.

Figure 2A:
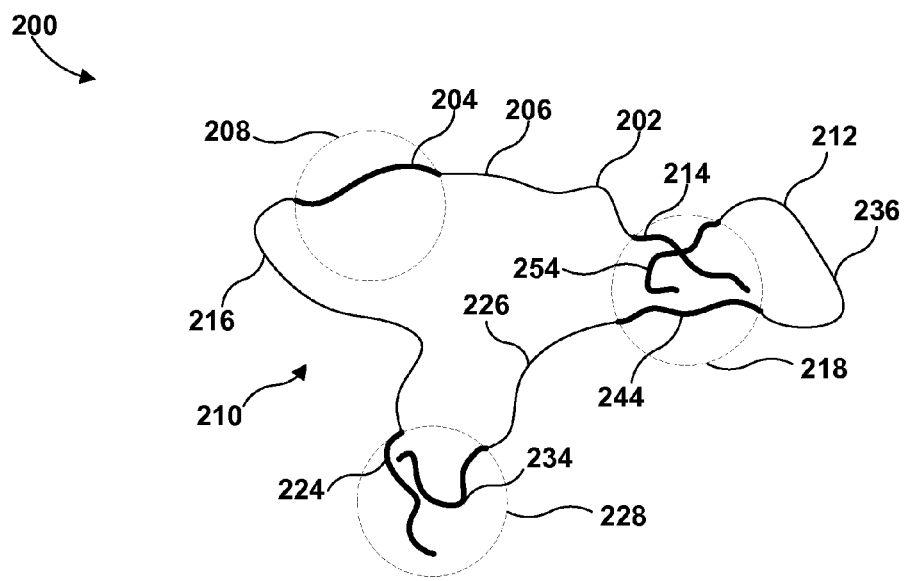
FIG. 2A is a representation of an ion gel formed by a pentablock copolymer in an ionic liquid.
Figure 2B:
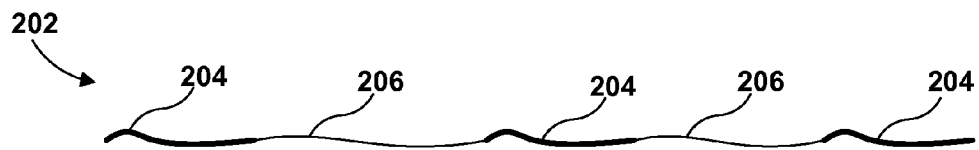
FIG. 2B is a representation of the pentablock copolymer shown in FIG. 2A.

In some embodiments, an ion gel 200 may also be formed by an at least pentablock copolymer. In the embodiment shown in FIGS. 2A and 2B, pentablock copolymer 202 includes three A blocks 204, 214, 224 each separated by B blocks 206, 216. Pentablock copolymer 202 extends through all three micelles 208, 218, 228, with A block 204 forming a part of micelle 208, A block 214 forming a part of micelle 218, and A block 224 forming a part of micelle 228. Pentablock copolymer 212 extends through only micelles 208 and 228, with two A blocks 244, 254 joined by B block 236 forming a part of micelle 218, and the third A block 234 (connected to A block 244 by B block 226) forming a part of micelle 228.

Utilizing an at least pentablock copolymer may increase the strength of the ion gel at a given weight percent polymer. While not wishing to be bound by any theory, this may be because three separate micelles 208, 218, 228 may include the each of three "A" blocks 204, 214, 224, as illustrated by pentablock copolymer 202 of FIG. 2A. Thus, for example, more energy may be required to pull copolymer chain 202 from the polymer network, which increases the mechanical strength of the ion gel.

The at least pentablock copolymer may comprise any useful monomers and block compositions, including, for example, any of the monomers or blocks described above. Some exemplary B blocks 206, 216, 226, 236 include, for example, polyethylene oxide, polymethylmethacrylate, or any other monomer compatible with the ionic liquid 210. Exemplary A blocks 204, 214, 224, 234, 244, 254 include, for example, polystyrene, poly(N-isopropyl acrylamide), polybutadiene, polydimethylsiloxane, polyethylene, and the like. Some preferred pentablock copolymers 202, 212 include poly(styrene-block-ethylene oxide-block-styrene-block-ethylene oxide-block-styrene) and poly(N-isopropyl acrylamide-block-ethylene oxide-block-N-isopropyl acrylamide-block-ethylene oxide-block-N-isopropyl acrylamide)

Figure 3A:
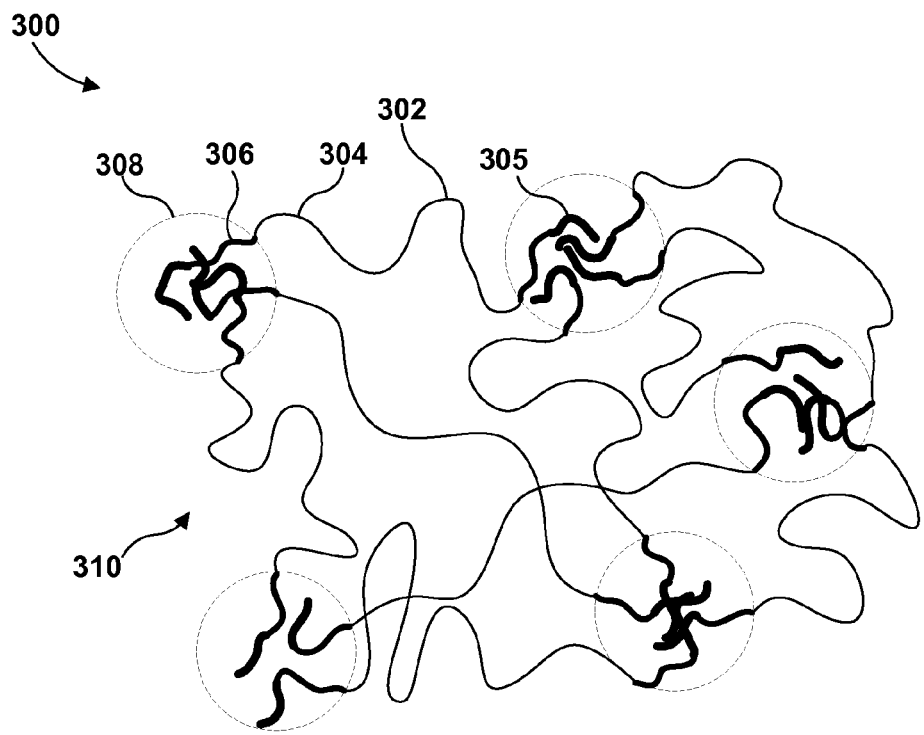
FIG. 3A is a representation of an ion gel formed by another pentablock copolymer in an ionic liquid.
Figure 3B:
FIG. 3B is a representation of the pentablock copolymer shown in FIG. 3A.

FIGS. 3A and 3B illustrate another ion gel 300 formed by a pentablock copolymer 302 in an ionic liquid 310. In this embodiment, the pentablock copolymer 302 includes two A blocks 306 connected by a B block 304. The opposite ends of each of the A blocks 306 are further connected to C blocks 305. This combination of two end blocks may allow the tailoring of the behavior of the polymer network in response to changes in temperature, pH, and the like. For example, the combination of A blocks 306 and C blocks 305 may be selected to provide the desired degree of compatibility with the ionic liquid 310. As a specific example, forming a pentablock copolymer of PNIPAm-PS-PEO-PS-PNIPAm may allow tailoring of the UCST. Adding PS blocks may raise the UCST compared to a triblock copolymer of PNIPAm-PEO-PNIPAm, and longer PS blocks may raise the UCST further. Eventually, when the PS blocks are sufficiently long, the ion gel 100 is no longer thermoreversible, mirroring the behavior of the PS-PEO-PS triblock copolymer, which indicates that the PS block is dominating the PNIPAm block.

This tailoring of the UCST may be carried out in other systems as well. Generally, adding a block of more strongly ionic liquid-incompatible polymer will raise the UCST, while adding a block of more ionic liquid-compatible polymer will lower the UCST.

In other embodiments, when copolymerization is feasible, the monomers of the A blocks 306 and the monomers of the C blocks 305 may be copolymerized in to form a random copolymer block attached to either end of the B block 306. This may allow greater tailoring of the solubility of the end blocks in the ionic liquid 310, and may allow greater control of the UCST, and thus greater control of the processing and use temperatures of the ionic gel.

Figure 4:
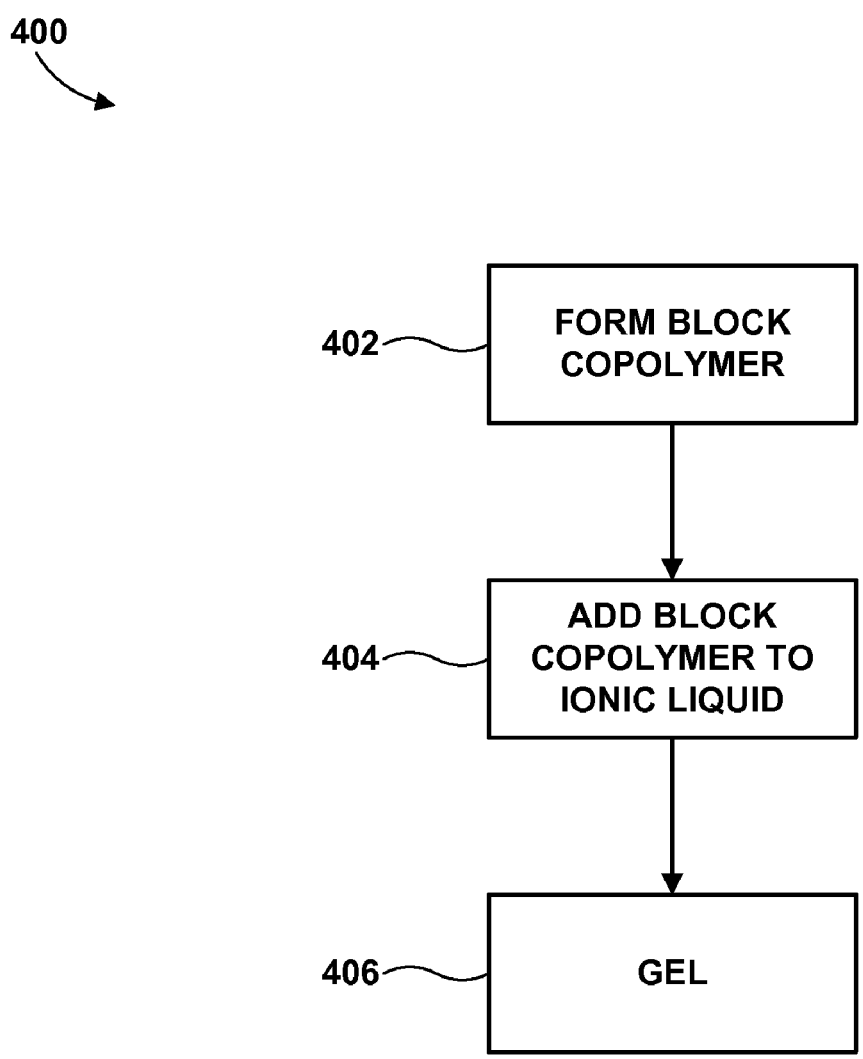
FIG. 4 is a flow chart illustrating a method of forming an ion gel.

FIG. 4 is a flowchart illustrating an exemplary method 400 of creating a polymer gel. First, the block copolymer is synthesized (402). For triblock copolymers, the synthesis follows appropriate controlled polymerization synthetic methods, such as living anionic polymerization, living cationic polymerization, controlled radical polymerization, RAFT (Reversible Addition/Fragmentation Transfer), ATRP (Atom Transfer Radical Polymerization), NMP (Nitroxide Mediated Polymerization), or the like.

The block copolymer is then added to the ionic liquid (404). In some embodiments, the block copolymer is added to the ionic liquid at room temperature along with a cosolvent. For example, poly(styrene-block-ethylene oxide-block-styrene) may be added to [BMIM][PF$_6$] along with methylene chloride. In other embodiments, the block copolymer may be added directly to the ionic liquid without the use of an additional solvent. In yet other embodiments, the copolymer may be added to the ionic liquid at an elevated temperature to form an ionic solution. Regardless of the method of addition of the copolymer to the ionic liquid, the mixture may be stirred for an amount of time sufficient to form a substantially homogeneous mixture (e.g., about 1 to about 24 hours).

Once a homogeneous mixture has been formed, the gel is allowed to form (406). This may occur by changing the temperature when the block copolymer is added at a temperature such that it initially forms a solution in the ionic liquid. In other embodiments, the gel may be formed by simply ceasing agitation of the mixture, or by allowing the cosolvent to evaporate.

Figure 5:
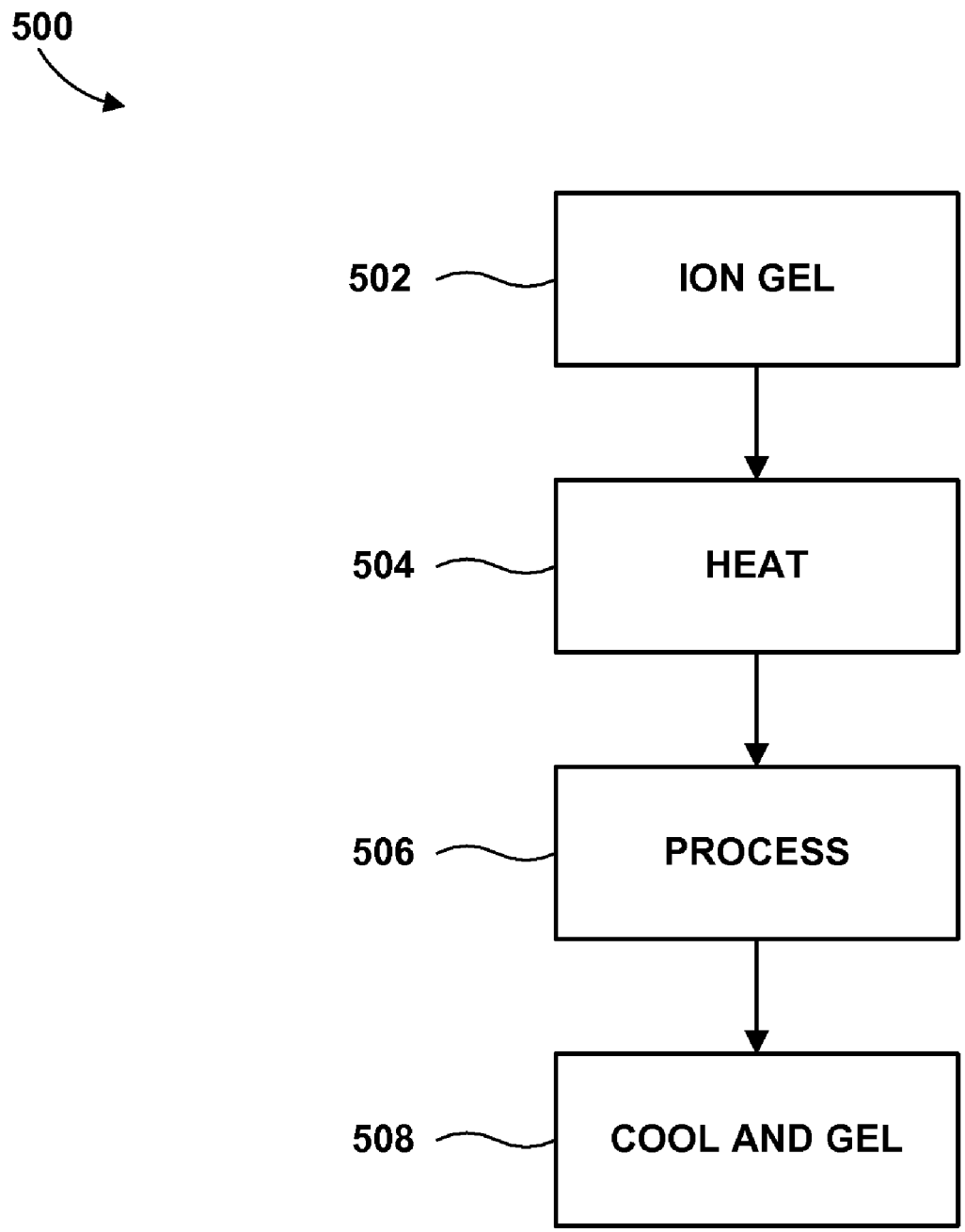
FIG. 5 is a flow chart illustrating a method of processing an ion gel.

FIG. 5 is a flow chart illustrating an example method 500 of processing a thermoreversible ionic gel. First, the ion gel is provided (502). The ion gel is then heated above the UCST, forming an ionic solution (504).

In other embodiments of the method, the ionic liquid may first be heated above the UCST and the block copolymer added to the heated ionic liquid. In these embodiments, a solution of the block copolymer in the ionic liquid is directly formed.

The liquid solution is then processed (506), which may be any desired process carried out on a liquid solution, such as inkjet printing, gravure printing, screen printing, flexographic printing, other methods of printing, coating methods, and the like.

Once the liquid solution has undergone the desired processing, the liquid solution is cooled below the upper critical solution temperature to form an ion gel (508).

Ion gels of the present disclosure may find a wide range of applicability in many industries including, for example, the electronics industry. As one example application in the electronics industry, the use of the disclosed ion gels as an electronic insulator layer in a transistor will be described hereinafter in further detail. While the following discussion will be primarily directed to transistors, the invention is not limited to only transistors. For example, the ion gels of the current disclosure may also find use in other electronic components, such as capacitors. As one example, integrated circuits including transistors and capacitors comprising an ion gel electronic insulator may provide improved performance compared to certain conventional devices, and may also provide manufacturing or processing advantages.

Typical transistors include a semiconductor layer connected to a source electrode and a drain electrode, an electronic insulator layer overlying the semiconductor layer, and a gate electrode overlying the insulator layer, with the ends of the gate electrode aligning with the edge of the source and drain electrodes.

It is generally desired that the electronic insulator layer used in transistors has a high dielectric constant, which allows the insulator layer to have a high capacitance value at small thicknesses. The high capacitance allows high current flow in the semiconductive layer between the source and drain electrodes when a voltage above the turn on voltage is applied to the gate electrode. It is also desirable that the electronic insulator layer has a fast response time to the applied gate voltage, so that the transistor may switch from an off state to an on state, and from the on state to the off state, in a desirably short amount of time.

As described above, the ion gels of the current disclosure provide relatively high ionic conductivities, which results in a high polarizability of the ion gel 100. This high polarizability leads to a high capacitance when the ion gel 100 is used as an insulator layer in a transistor, as will be described in further detail below. The high ionic conductivity of the ion gel 100 may also lead to relatively fast response times to an applied gate voltage.

Figure 6:
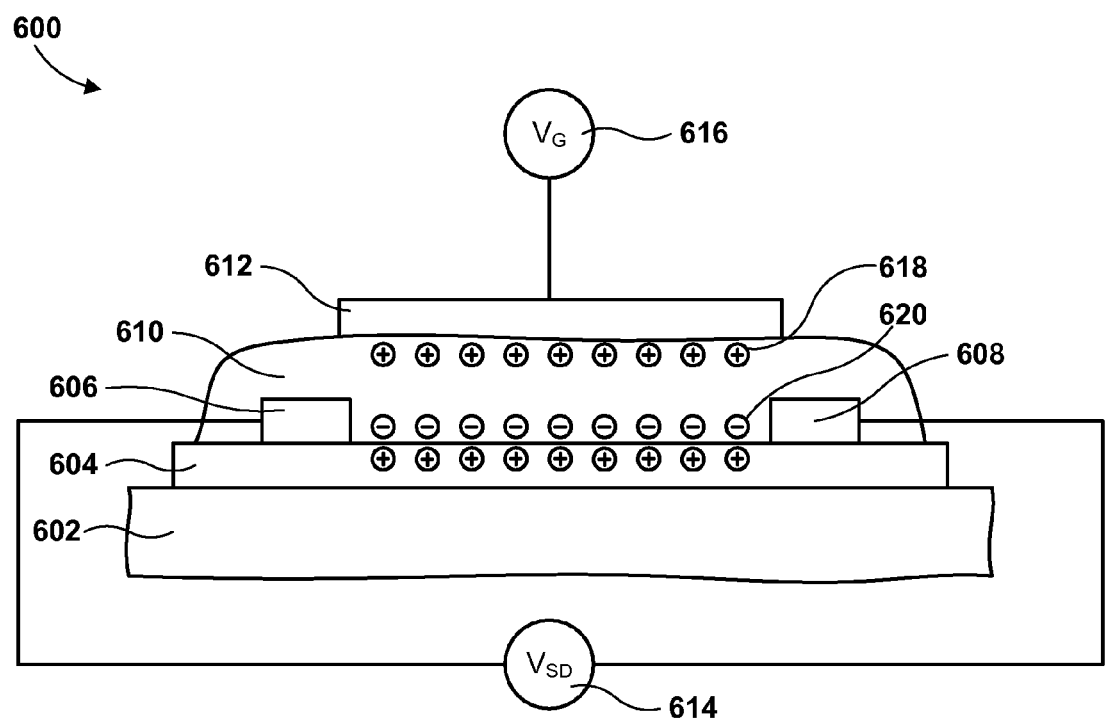
FIG. 6 is a schematic diagram of an exemplary FET.
Figure 7:
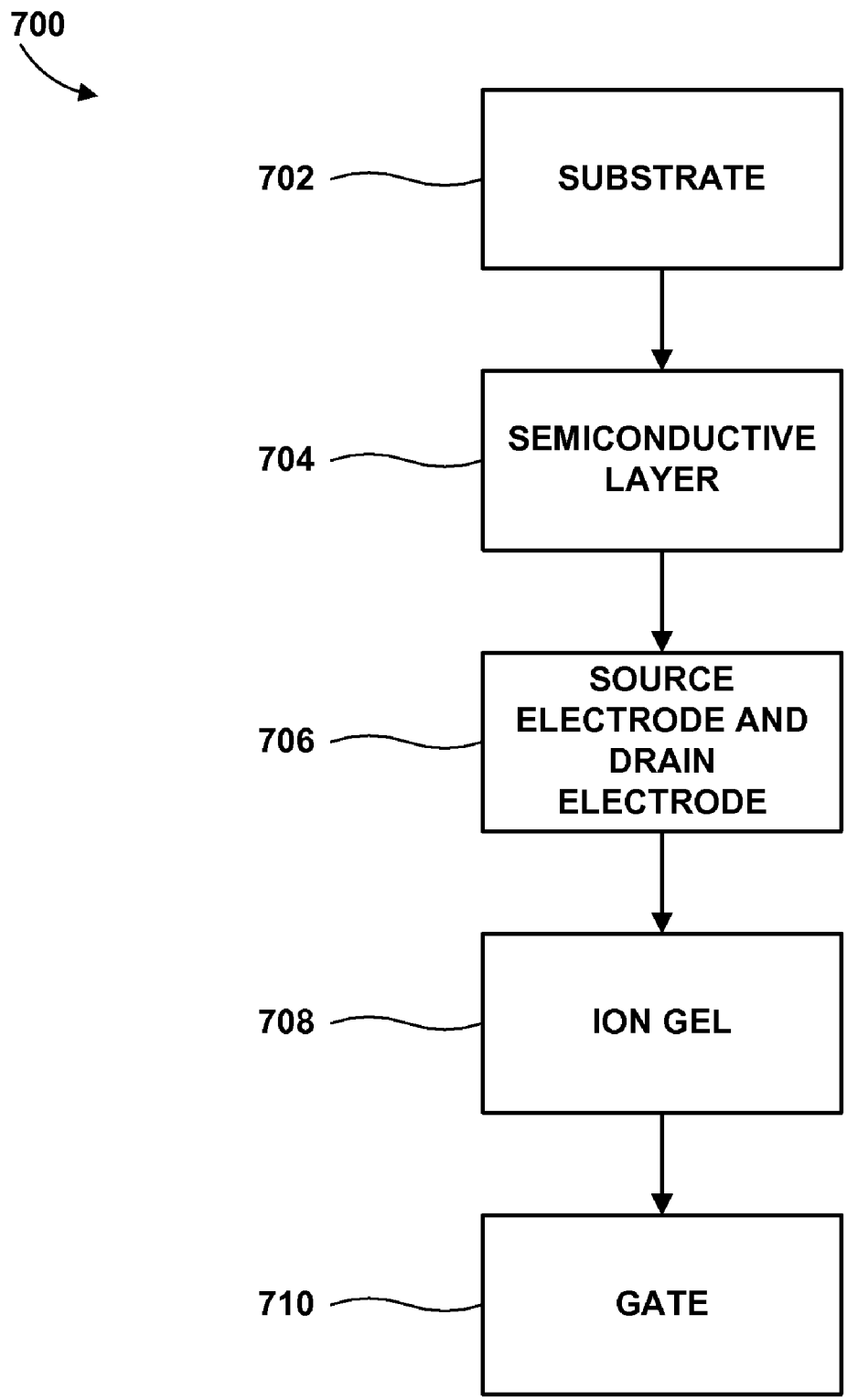
FIG. 7 is a flow chart illustrating an exemplary method of forming the FET of FIG. 6.

An exemplary thin film transistor (TFT) 600 is shown in FIG. 6, and an exemplary method 700 of making the TFT 600 is shown in FIG. 7. The TFT 600 includes a substrate 602 and a semiconductor layer 604 deposited on the substrate 602. The TFT 600 also includes a source electrode 606 and a drain electrode 608 attached to the semiconductor layer 604. The source electrode 606 and drain electrode 608 are connected to opposite terminals of a common voltage source ($V_{SD}$) 614. The semiconductor layer 604, source electrode 606, and drain electrode 608 are partially or completely covered by an ion gel layer 610. Finally, a gate electrode 612, which is connected to a second voltage source 616, is located on the ion gel layer 610.

The source electrode 606, drain electrode 608, and gate electrode 612 may comprise any suitable conductive material, including gold, silver, copper, conductive alloys, and the like. In some embodiments, the gate electrode 612 may be supported by a polyester film that is pressed onto the ion gel layer 610.

The substrate 602 may include a wide range of materials, including substantially rigid materials such as, for example, glass, silicon, and the like. In other embodiments, the substrate 602 may include flexible materials, including, for example, paper, a polymer or mixture of polymers, textiles, and the like. Flexible substrates are generally preferred, as the transistors described in the current disclosure are well-adapted to production through processes including, for example, inkjet printing, which may be particularly useful for forming flexible circuits on flexible substrates.

The semiconductor layer 604 may include any useful semiconductor, including traditional semiconductors such as silicon, germanium, gallium arsenide, and the like. In other embodiments, the semiconductor layer may include an organic semiconductor, including a semiconductive oligomer or a semiconductive polymer, or semiconductors including nanowires, nanoparticles, or films thereof. Exemplary organic semiconductors include, for example, pentacene, poyacetylene, polyaniline, and the like. Preferred organic semiconductors include poly(3-hexylthiophene) (P3HT), poly[5,5'-bis(3-dodecyl-2-thienyl)-2,2'-bithiophene] (PQT-12), and poly(9,9'-dioctylfluorene-co-bithophene) (F8T2).

The ion gel layer 610 may include any useful ion gel, including any of the ion gels described above. Preferred non-thermoreversible ion gels include S—O—S/[EMIM][TFSI], S—O—S/[BMIM][PF$_6$], and S—O—S/[EMIM][OctSO$_4$]. The ion gel layer 610 may also include a thermoreversible ion gel including, for example, PNIPAm-PEO-PNIPAm/ [EMIM][TFSI], PNIPAm-PS-PEO-PS-PNIPAm/[EMIM] [TFSI], and the like.

As shown in FIG. 6, the application of a voltage to the gate electrode 612 induces an electric field in the ion gel layer 610. In the exemplary embodiment, a negative applied voltage induces an electric field that causes the ion gel layer 610 to polarize, with the negative ions in the ionic liquid being repelled from the gate electrode and the positive ions being attracted to the gate electrode. The polarization of the ion gel layer 610 induces a charge build-up of negative carriers near the interface of the semiconductor layer 604 and the ion gel layer 610, similar to the capacitive effect of traditional dielectric insulator layers.

Conversely, a positive voltage applied to the gate electrode 612 would result in a build-up of positive charges in the ion gel layer 610 at the interface of the ion gel layer 610 and the semiconductor layer 604, and a build-up of negative charges in the near-interface region of the semiconductor layer 604.

High ionic conductivity, then, is desired to provide a high polarizability, which results in a large amount of charge build-up in the near-interface region of the semiconductor layer 604 for a given voltage. As discussed above, self-assembled ion gels of the current disclosure provide greatly increased ionic conductivity when compared to conventional polymer electrolytes. High ionic conductivity is also desired to provide increased switching speeds for the transistors. Switching speeds are effectively limited by time required for the charge to accumulate and/or dissipate at the interface of the ion gel layer 610 and the semiconductor layer 604.

Switching speeds accomplished by transistors including the disclosed ion gels vary, but are generally significantly higher than transistors using polymer electrolytes. For example, transistors using an ion gel layer 610 including a S—O—S/[BMIM][PF$_6$] ion gel may operate at switching speed up to and greater than 100 Hz. In some embodiments, such as those utilizing a 7 wt. % S—O—S in [EMIM][TFSI] ion gel layer 610 and a P3HT semiconductor layer 604, switching speeds of up to 10 kHz have been achieved. Even higher switching speeds may potentially be achievable using other, more ionically conductive, ion gels. Switching speeds may be expected to increase with any method of increasing ionic conductivity, such as a more ionically conductive ionic liquid, lower concentrations of block copolymer, a higher operating temperature, or using block copolymers that have a B block with a low $T_g$, and thus faster segmental dynamics. The switching speed may also be dependent on the dimensions of the device, including the channel width and length, the ion gel layer 610 thickness, and the like.

The amount of charge build-up in the near-interface region of the semiconductor layer 604 directly relates to the source-drain voltage necessary to produce a given current flow in the semiconductor layer 604. Thus, a high ionic conductivity of the ion gel layer 610 leads to lower operating voltages for the transistor, and presumably, lower power consumption of devices using transistors including an ion gel layer 610 of the current disclosure. This may be particularly advantageous for portable electronic devices, which often rely on batteries with limited power capacity. For example, a TFT 600 including a S—O—S in [EMIM][TFSI] ion gel layer 610 and a P3HT semiconductor layer 604 and a 20 μm (long) by 200 μm (wide) channel has a saturation current of about 600 μA at gate voltage of about −3 V and a drain voltage of about −1 V.

An exemplary method 700 of making the TFT 600 of FIG. 6 is illustrated in FIG. 7. First, a substrate 602 is provided (702). As discussed above, the substrate 602 may include any useful material including, for example, paper, plastic, silicon, glass, and the like. In some embodiments, the substrate may be large enough to accommodate sufficient TFTs 600 to form a circuit, such as thousands millions, or more TFTs 600.

A semiconductor layer 604 is then deposited onto the substrate (704). The semiconductor layer 604 may include a conventional semiconductor, such as silicon, germanium, and the like, or may include an organic semiconductor. In embodiments where the semiconductor layer 604 includes an organic semiconductor, the semiconductor layer 604 may be deposited onto the substrate through any one of a number of processes, including, for example, spin-coating, inkjet printing, solvent evaporation, dip coating, screen printing, and the like.

In the illustrated embodiment of FIG. 7, the source electrode 606 and drain electrode 608 are then deposited (706) onto the semiconductor layer. The source electrode 606 and drain electrode 608 may be deposited using conventional deposition techniques, including, for example, thermal evaporation through a stencil, inkjet printing, screen printing, gravure printing, flexographic printing, and the like.

An ion gel layer 610 is then deposited (708) over at least an area of the semiconductor layer 604 that includes the source electrode 606 and the drain electrode 608. The ion gel layer 610 may partially or completely cover the source electrode 606 and drain electrode 608, and should preferably cover substantially the entire semiconductor layer 604 between the source electrode 606 and drain electrode 608.

The ion gel layer 610 may deposited through any useful process, and may be deposited in gel or liquid form. When the ion gel layer 610 is deposited in gel form, the ion gel layer 610 may be simply applied onto the semiconductor layer 604 using pressure.

Depositing the ion gel layer 610 in liquid form is generally preferred. In embodiments including a thermoreversible ion gel layer 610, the ion gel may be heated above its UCST and deposited in liquid form. The ion gel layer may then be cooled below the UCST, which causes gelation. In embodiments including a non-thermoreversible ion gel layer 610, the block copolymer and ionic liquid may be dissolved in a cosolvent, deposited on the TFT, and the cosolvent evaporated to leave an ion gel layer 610.

Depositing the ion gel layer 610 in liquid form may allow the used of continuous deposition processes, including, for example, printing. Any suitable method of printing may be utilized, including, for example, aerosol printing, inkjet printing, rotogravure printing, screen printing, flexographic printing coating methods, and the like.

Finally, the gate electrode 612 is deposited (710) on the ion gel layer 610. The gate electrode may be deposited using any suitable process, including any of the deposition methods described with respect to the source electrode 606 and drain electrode 608. Additionally, the gate electrode 612 may optionally be supported by a film, such as, for example, a polymeric film. The polymeric film may then be attached to the ion gel layer 610, aligning the gate electrode 610 with the TFT 600.

Figure 8:
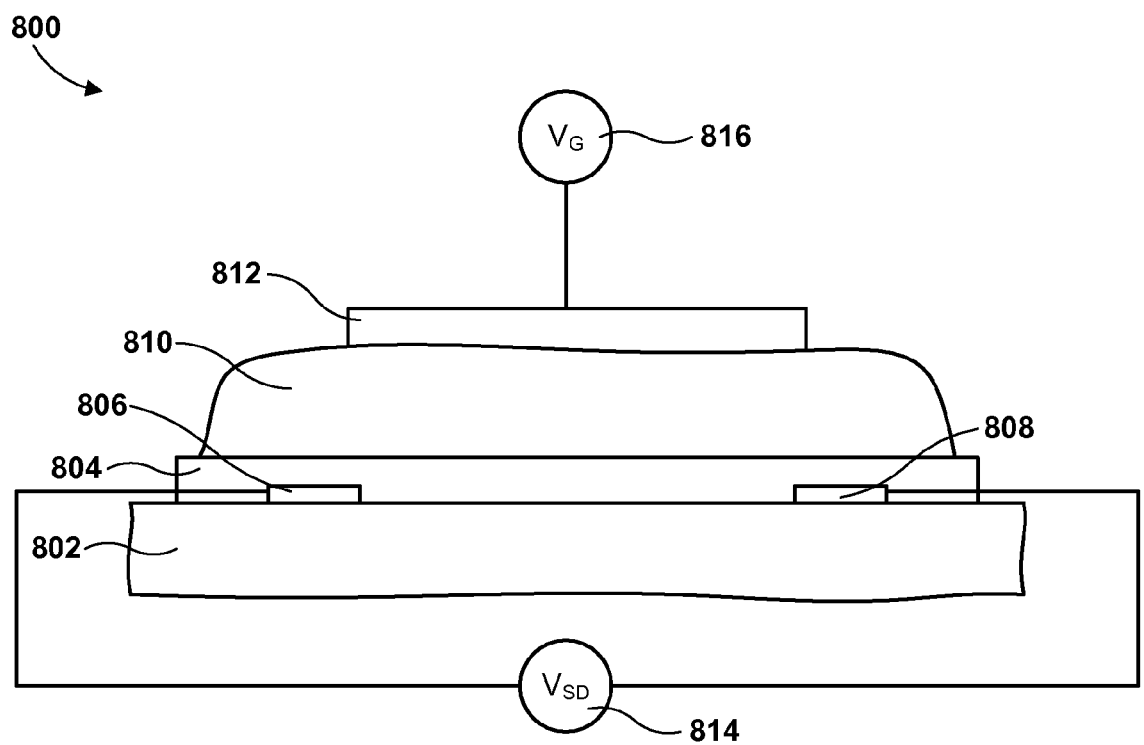
FIG. 8 is a schematic diagram of another exemplary FET.
Figure 9:
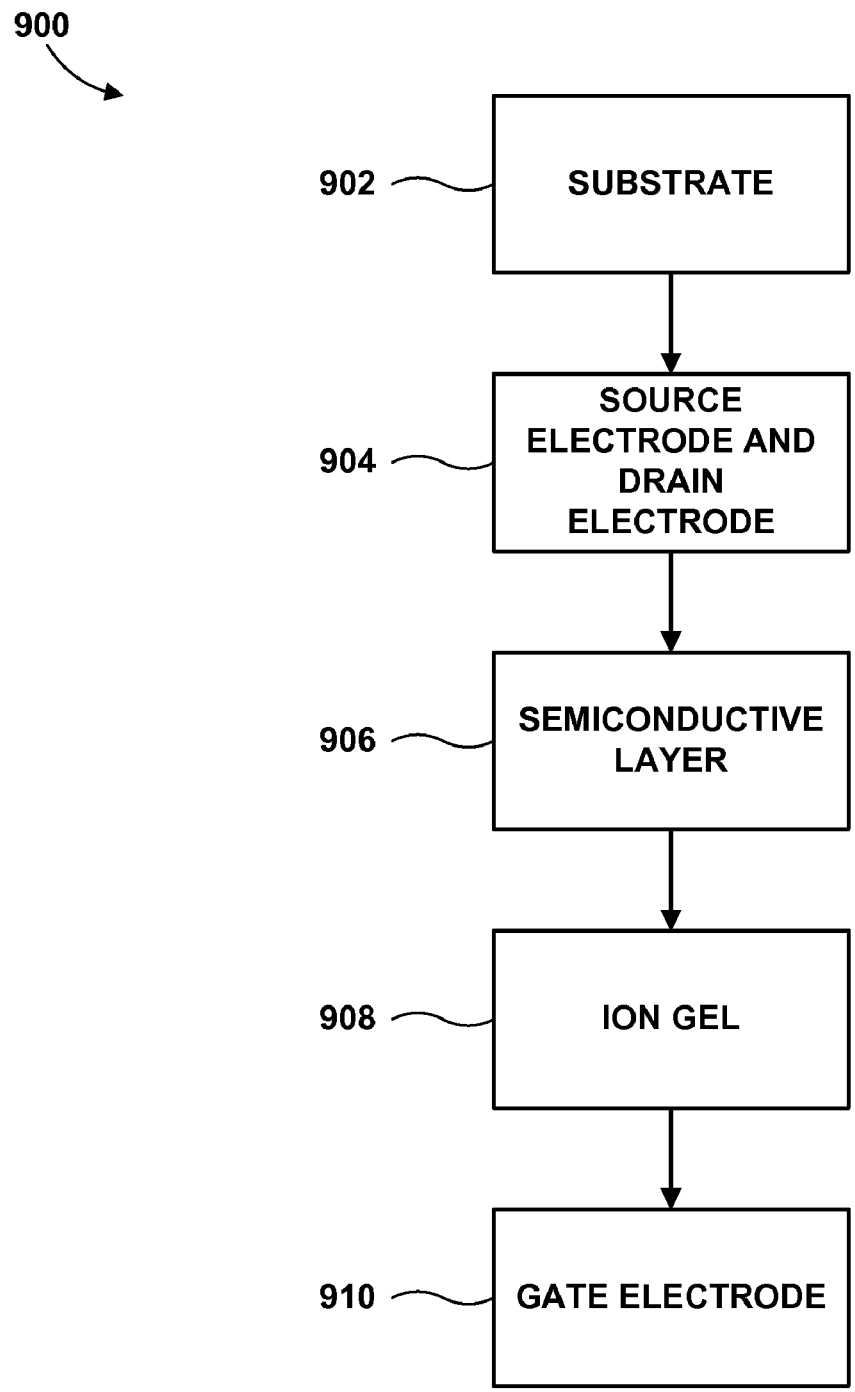
FIG. 9 is a flow chart illustrating an exemplary method of forming the FET of FIG. 8.

A second exemplary TFT 800 is shown in FIG. 8, and an exemplary method 900 of forming such a TFT 800 is illustrated in FIG. 9. The TFT 800 of FIG. 8 is largely similar to the TFT 600 of FIG. 6; however, the source electrode 806 and drain electrode 808 are located adjacent the substrate 802, and are covered by the semiconductor layer 804. Construction of a TFT 800 in this configuration may allow the source electrode 806 and drain electrode 808 to be deposited (904) on the substrate 802 prior to the deposition (906) of semiconductor layer, which may provide processing advantages. For example, depositing the source electrode 806 and the drain electrode 808 prior to the deposition of the semiconductor layer 804 may protect the semiconductor layer 804 from any extreme processing conditions used to deposit the source electrode 806 and drain electrode 808, such as high temperatures.

The full production method 900, then, includes providing (902) a substrate 802 and depositing (904) a source electrode 806 and a drain electrode 808 on the substrate 802. A semiconductor layer 804 is then deposited (906) over the substrate 802, the source electrode 806, and the drain electrode 808 using any of the methods described above with respect to FIG. 7. The semiconductor layer 804 preferably fully covers at least a section of the substrate 802, the source electrode 806, and the drain electrode 808. The area of the semiconductor layer 804 between the source electrode 806 and the drain electrode 808 defines a channel length and channel width of the TFT 800. An ion gel layer 810 is then deposited (908) over the semiconductor layer 804. The ion gel layer 810 extends at least the length and width of the channel, and may be deposited using any of the above-described processing techniques. Finally, a gate electrode 812 is deposited (910) on the ion gel layer 810.

Figure 10:
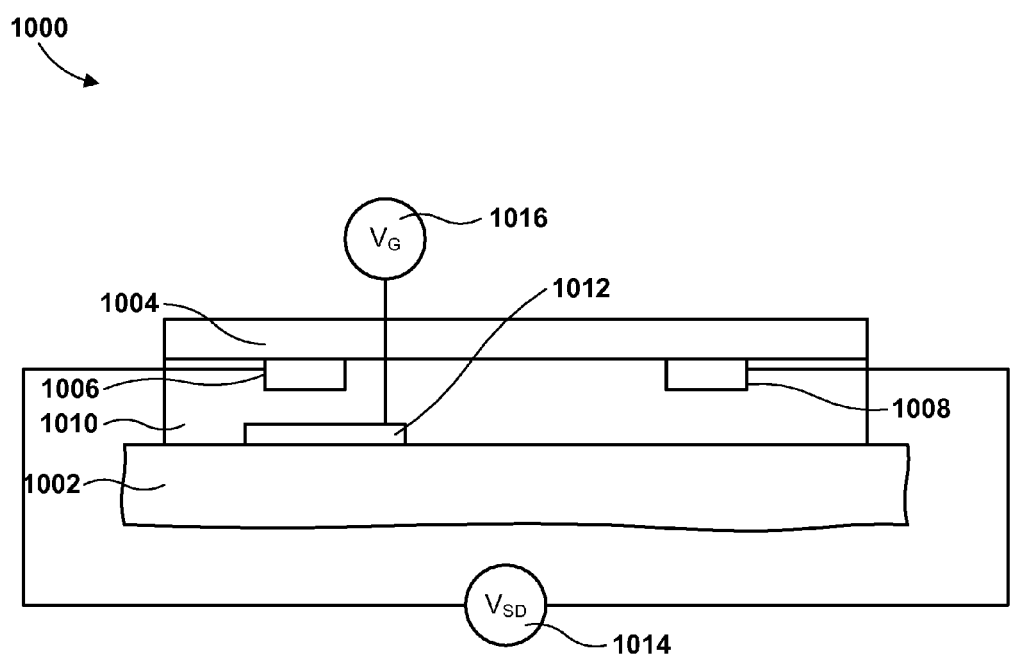
FIG. 10 is a schematic diagram of another exemplary FET.
Figure 11:
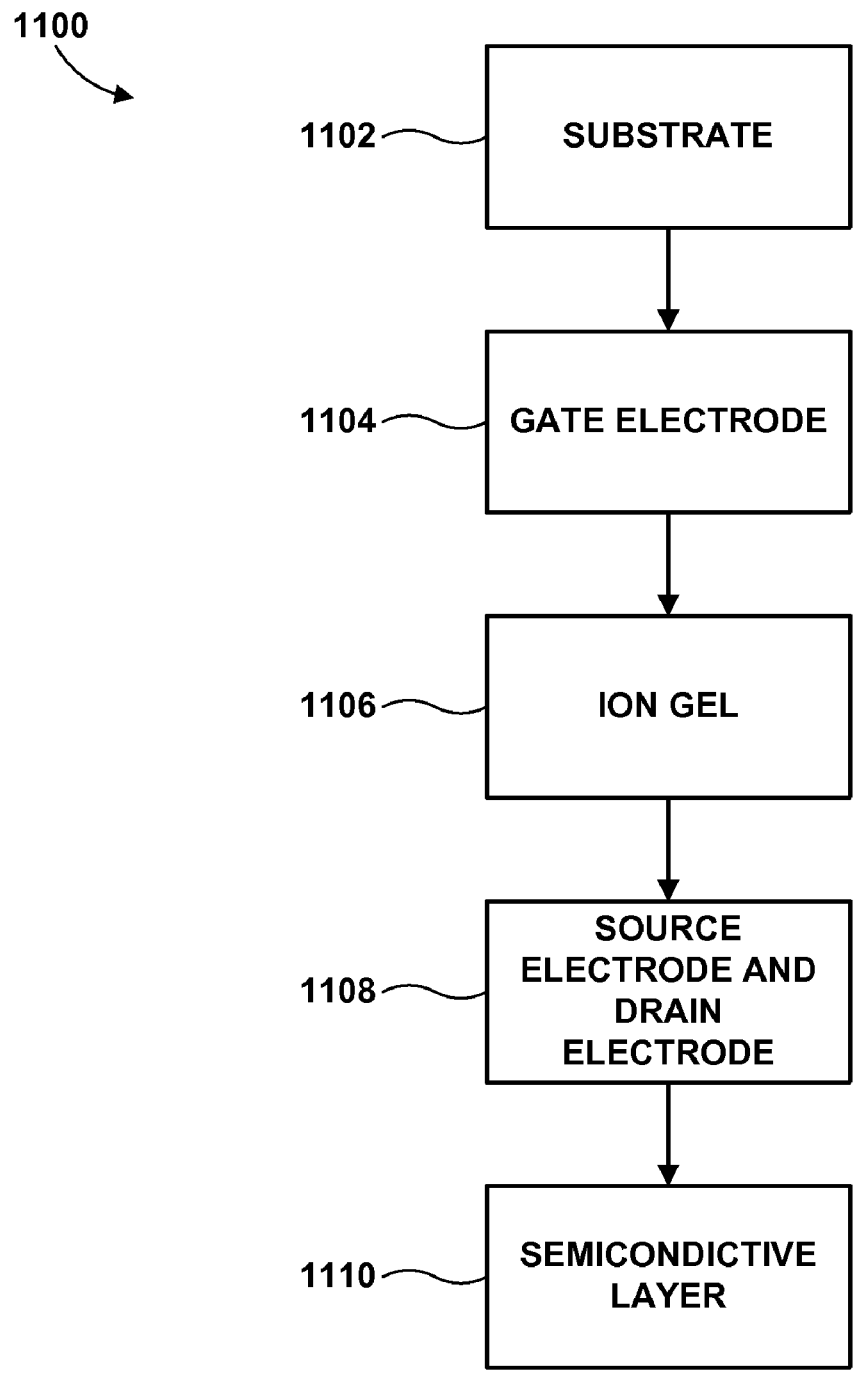
FIG. 11 is a flow chart illustrating an exemplary method of forming the FET of FIG. 10.

Yet another exemplary TFT 1000 is shown in FIG. 10, and an exemplary method 1100 of making TFT 1000 is shown in FIG. 11. In this embodiment, a substrate 1002 is provided (1102), and a gate electrode 1012 is deposited (1104) on the substrate 1002. An ion gel layer 1010 is then deposited (1106) over the gate electrode 1012 and at least a section of the substrate 1002. A source electrode 1006 and drain electrode 1008 are deposited (1108) on the ion gel layer 1010. Finally, a semiconductor layer 1004 is deposited (1110) over at least a portion of the ion gel layer 1010 extending between the source electrode 1006 and the drain electrode 1008. The source electrode 1006 and drain electrode 1008 are connected to a voltage source ($V_{SD}$) 1014, and the gate electrode is connected to a voltage source ($V_G$) 1016.

FIG. 10 illustrates that the gate electrode 1012 need not be aligned with the channel between the source electrode 1006 and the drain electrode 1008, as is common in conventional transistors. The high polarizability of the ion gel layer 1010 allows the ion gel layer 1010 to be polarized so strongly that the interface of the ion gel layer 1010 and the semiconductor layer 1004 will be polarized regardless of the exact placement of the gate electrode 1012. This may allow decreased manufacturing precision, which may decrease the number of defective TFTs 1000, or may allow an increased throughput during the manufacturing of the TFTs 1000.

Figure 12:
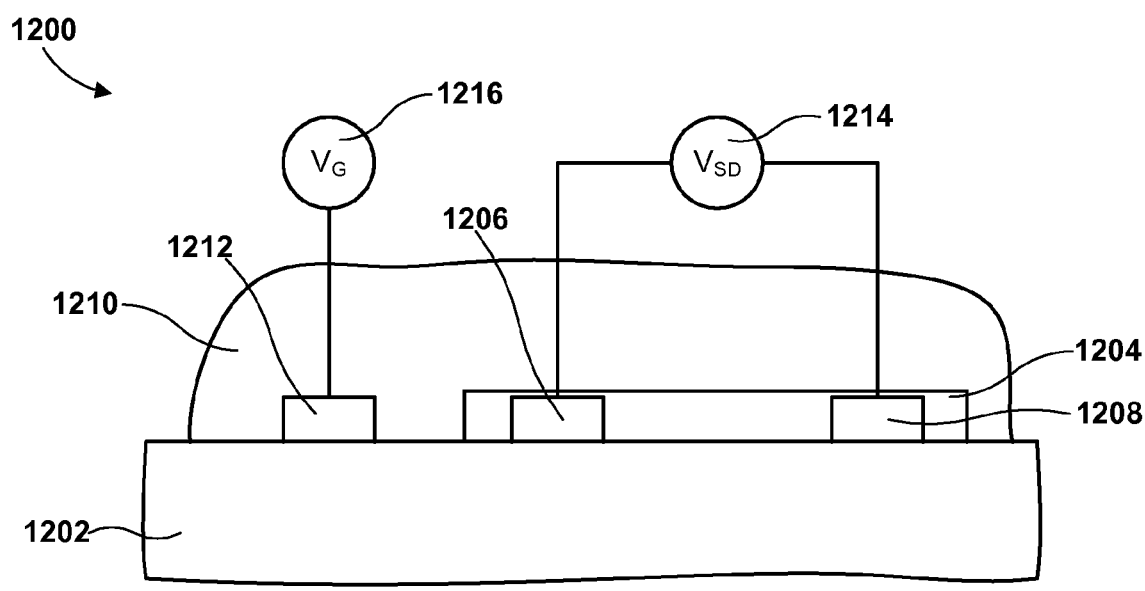
FIG. 12 is a schematic diagram of another exemplary FET.

A final exemplary TFT 1200 is illustrated in FIG. 12. The illustrated TFT 1200 construction may allow increases in manufacturing speed. Specifically, TFT 1200 features a gate electrode 1212, source electrode 1206 and drain electrode 1208 that are located on the surface of a substrate 1202. A semiconductor layer 1204 is located on a substrate 1202 and partially or completely covers source electrode 1206 and drain electrode 1208. At least the section of the substrate 1202 on which the gate electrode 1212, source electrode 1206, drain electrode 1208, and semiconductor layer 1204 are located is partially or completely covered by ion gel layer 1210. The source electrode 1206 and drain electrode 1208 are connected to a common voltage source ($V_{SD}$) 1214, and the gate electrode 1212 is connected to a separate voltage source ($V_G$) 1216.

Conventional insulator layers may not allow this construction of TFT 1200. For example, the polarizability of conventional insulator layers may not be sufficiently high to allow the formation of a conductive channel in the semiconductor layer 1204 between the source electrode 1206 and drain electrode 1208 when the gate electrode 1212 is offset, and especially when the source electrode 1206, drain electrode 1208, and gate electrode 1212 are substantially coplanar, as in FIG. 12. However, the high polarizability of the ion gel layer 1210 of the current disclosure allows the polarization of the ion gel layer 1210 at the interface of the semiconductor layer 1204 and ion gel layer 1210 between the source electrode 1206 and drain electrode 1208 even when the gate electrode 1208 is offset from the source electrode 1206 and drain electrode 1208.

Figure 13:
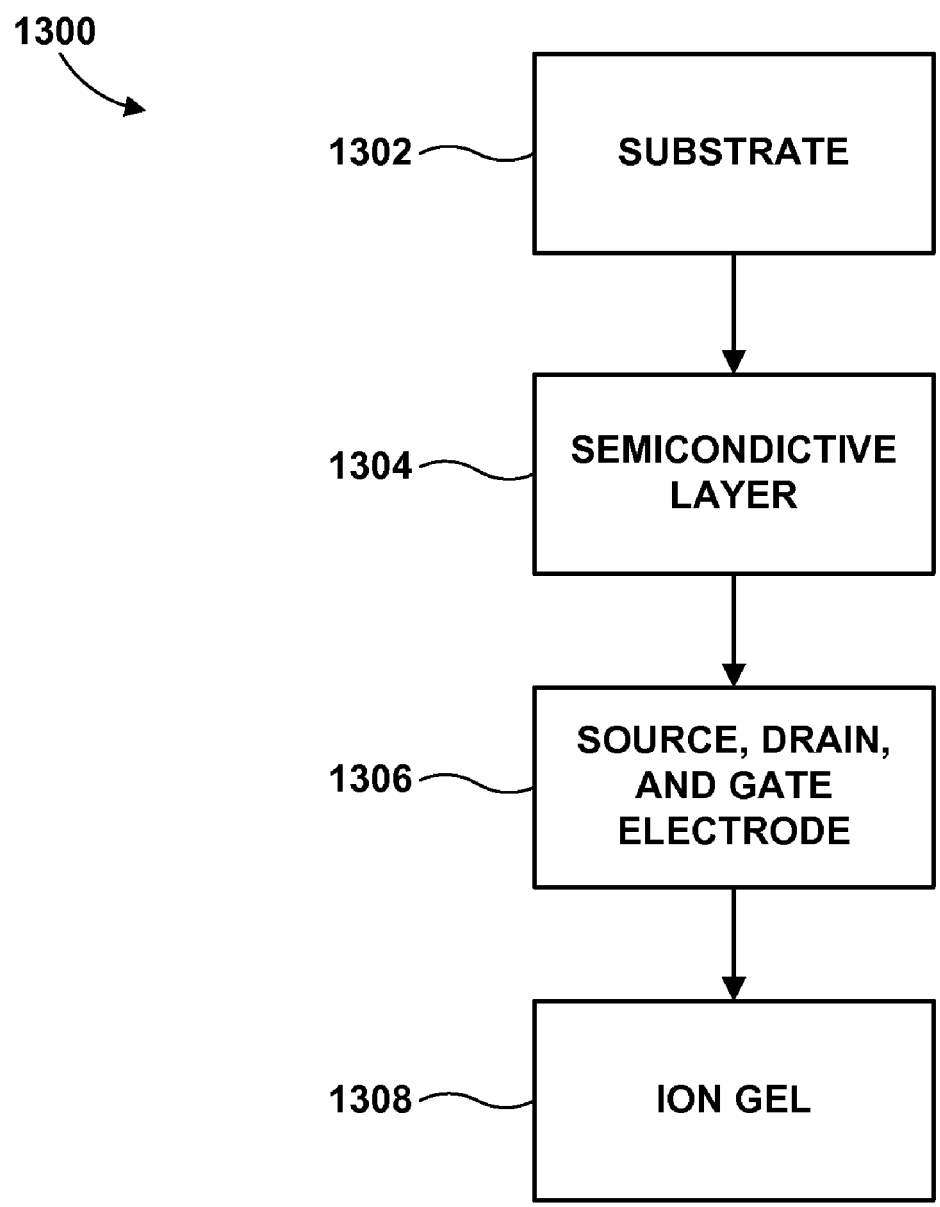
FIG. 13 is a flow chart illustrating an exemplary method of forming the FET of FIG. 12.

FIG. 13 illustrates an exemplary method 1300 of forming the TFT 1200 of FIG. 12. First, a substrate 1202 is provided (1302). The source electrode 1206, drain electrode 1208, and gate electrode 1212 are then deposited (1304) on the substrate 1202. The electrode deposition may be through conventional methods, such as, for example, thermal evaporation through a stencil, and the like, or the electrodes 1206, 1208, 1212 may be printed on the substrate 1202. A semiconductor layer 1202 is then deposited (1306) on the substrate and overlying at least a portion of the source electrode 1206 and drain electrode 1208, using any useful method, including, for example, spin coating, printing, solvent evaporation, and the like. Finally, an ion gel layer 1210 is deposited (1308) over an area of the substrate 1202 including at least a portion of the gate electrode 1212, and at least a portion of the semiconductor layer 1204 between the source electrode 1206 and drain electrode 1208.

Depositing the source electrode 1206, drain electrode 1208, and gate electrode 1212 at the same processing step may simplify manufacture of the TFT 1200. For example, this geometry allows deposition of all three electrodes at substantially simultaneous times, and also allows deposition of all three electrodes 1206, 1208, 1212 prior to deposition of the ion gel layer 1210. This may protect the ion gel layer 1210 from any processing parameters used to deposit the electrodes 1206, 1208, 1212 that may be undesirable (e.g., high temperature).

Any of the above-described TFTs may be used to form an integrated circuit. The integrated circuit may include tens, hundreds, thousands, or more TFTs, and may also include other components, such as, for example, resistors, capacitors, LEDs, other transistors, and the like. The TFTs may be deposited on the same substrate, and may be substantially coplanar on the substrate, or may be deposited in multiple layers on the substrate, e.g., two or more TFT layers one on top of the other. The individual TFTs may be formed by any of the methods described herein.

EXAMPLES

Example 1

Preparation of S—O—S/[BMIM][$PF_6$] Ion Gels

A symmetric poly(styrene-block-ethylene oxide-block-styrene) (S—O—S) triblock copolymer, synthesized through living anionic polymerization, was purchased from Polymer Source, Inc. and used as received. We denote this copolymer S—O—S, where S represents styrene and O ethylene oxide. The triblock copolymer has an overall number average molecular weight of $M_n$=34 kg/mol and a polydispersity of $M_w/M_n$=1.23, as characterized by gel permeation chromatography based on a poly(ethylene oxide) (PEO) standard. $^1$H NMR was used to determine the block copolymer composition and the weight fraction of PEO:$f_{PEO}$=72%. [BMIM][$PF_6$] was purchased from Solvent Innovation GmbH. [BMIM][$PF_6$] is slightly moisture sensitive, so care was taken to minimize air exposure during solution preparation and experimental measurements.

Six S—O—S/[BMIM][$PF_6$] polymer electrolytes were made with S—O—S concentrations of 1 wt. %, 3 wt. %, 4 wt. %, 5 wt. %, 7 wt. %, and 10 wt. %, respectively. For each sample, weighed amounts of S—O—S and [BMIM][$PF_6$] were dissolved in a cosolvent, methylene chloride. The cosolvent was removed by evaporation at ambient temperature for 24 h, followed by vacuum evaporation at 70° C. until constant weight was achieved. All samples were transparent. The 1 wt. % and 3 wt. % samples were liquid solutions, the 4 wt. % sample was very viscous, and the 5 wt. %, 7 wt. %, and 10 wt % samples appeared to be transparent gels.

Example 2

Conductivity of S—O—S/[BMIM][$PF_6$]

The ionic conductivity of the samples from Example 1 was determined in a homemade cell by means of impedance measurements using a Solartron 1255B frequency response analyzer at an AC amplitude of 10 mV. The frequency range employed for the measurements was typically 1 MHz to 1 Hz. The cell was made of two stainless steel disks (electrodes) separated by a Teflon spacer. The cell has a defined volume with a 7 mm inner diameter and a 2 mm inner depth. The samples were filled in the cell, which was then enclosed in a sealed Teflon bag and immersed in a thermostated water bath. The temperature was controlled to within ±0.5° C. of the set point. All samples were thermally equilibrated at each temperature for 20 min prior to the measurements. The cell constant was calibrated before and after each experiment using a KCl conductivity standard solution purchased from Sigma-Aldrich.

Figure 14:
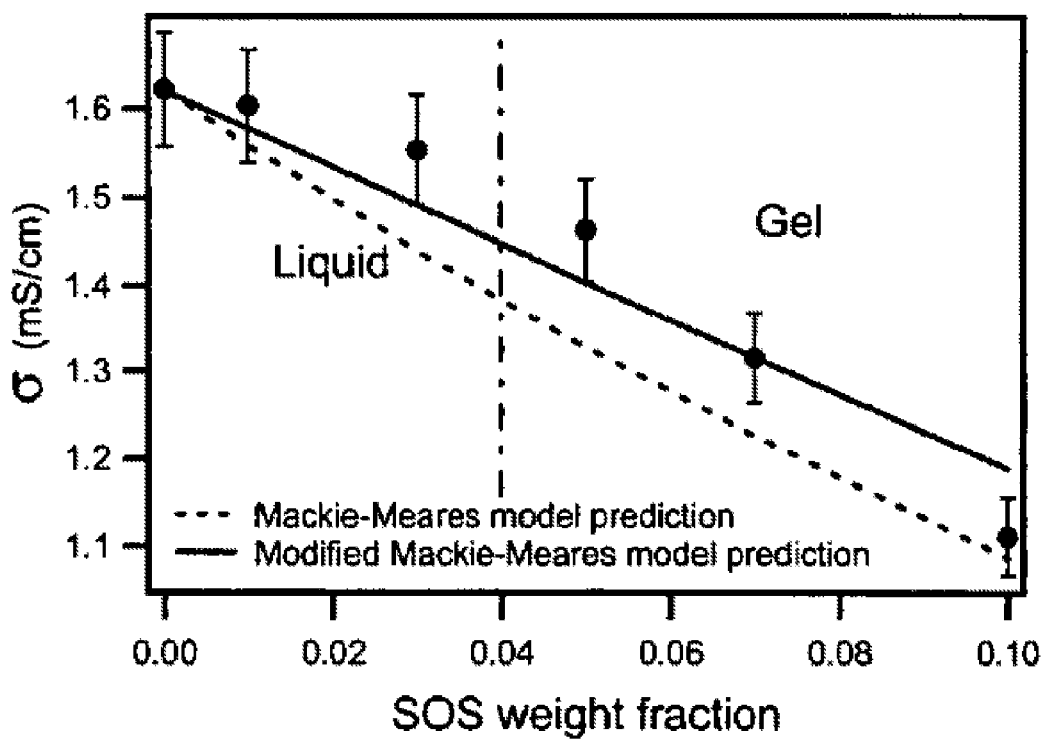
FIG. 14 is a plot of modulus versus angular frequency.

The ionic conductivity (σ) at 26.5° C. of five S—O—S/[BMIM][PF$_6$] polymer electrolytes along with that for bulk [BMIM][PF$_6$] are presented in FIG. 14. Over this concentration range, the σ of the ion gels was found to be only modestly affected by the structuring polymer network, and the intrinsic mobility of the bulk [BMIM][PF$_6$] decreases only slightly, as evidenced in FIG. 14. This implies a simple but promising way to make highly conductive solid-state electrolytes. By selecting an ionic liquid with the desired ionic conductivity, it should be possible to design appropriate triblock copolymers to form ion gels that do not lower the high ionic conductivity of the ionic liquid. In the S—O—S/[BMIM][PF$_6$] model system, σ reaches about 1 mS/cm at room temperature, which is comparable to or higher than the values reported for conventional polymer electrolytes.

Inspection of the concentration dependence, shown in FIG. 14, shows that σ decreases slightly with increasing S—O—S fraction. Above the gel point, there may be a somewhat stronger concentration dependence. However, even for the S—O—S/[BMIM][PF$_6$] ion gel with 10 wt. % S—O—S, σ is only reduced by about 30% from the pure ionic liquid.

Example 3

Rheological Testing of S—O—S/[BMIM][PF$_6$]

Oscillatory shear measurements were performed on a Rheometrics Fluids spectrometer (RFS II) using a parallel plate geometry. Both 50 and 25 mm diameter plates were employed, depending on the modulus of the sample. A gap spacing of approximately 1 mm was used for all measurements. The gap was adjusted at each temperature to compensate for the thermal expansion of the tool set. The dynamic storage and loss moduli were examined in the linear viscoelastic regime at 10° C. intervals between 10° C. and 100° C. For the 10 wt. % sample, strain sweep experiments were taken at three fixed frequencies to determine the gel strength. The temperature was controlled to within ±0.2° C. of the set point with an environmental control circulator.

The three liquid solutions were directly loaded onto the plate in the experiments. For the three gels, the samples were prepared as follows. Weighed amounts of S—O—S and [BMIM][PF$_6$] were dissolved in methylene chloride. Most of the cosolvent was evaporated at ambient temperature. The resulting very viscous solution was carefully coated onto the lower plate of the rheometer before placing it in a vacuum oven to completely remove the cosolvent. This method significantly reduced air bubbles inside the samples and produced a film that was more uniform than that achieved by direct loading or molding.

Figure 15:
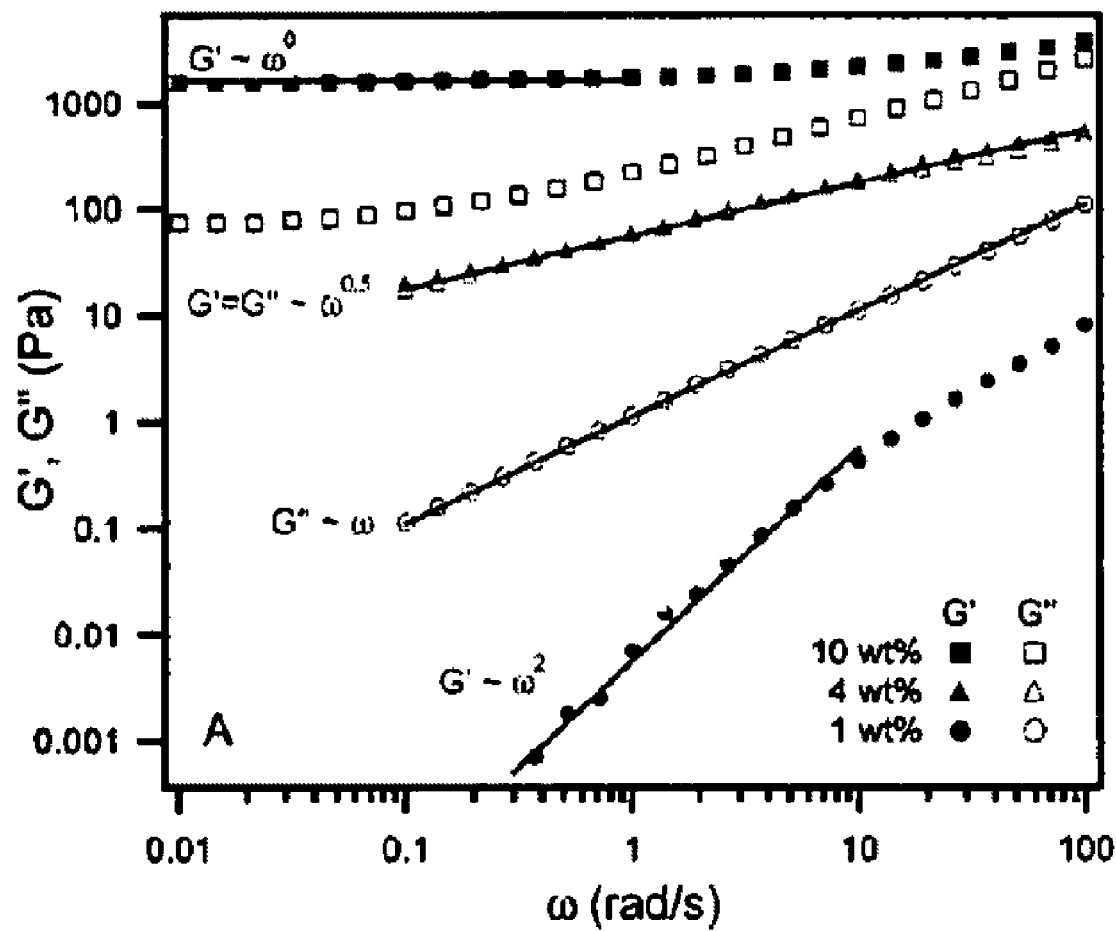
FIG. 15 is a plot of conductivity versus triblock copolymer weight fraction.

Representative data measured at 10° C. are shown in FIG. 15. The 1 wt. % sample was a liquid. Its dynamic storage modulus (G') is smaller than its loss modulus (G"), and both moduli exhibit different power law dependences on the angular frequency (ω) in the low-frequency window (ωτ<<1, where τ is the longest relaxation time of the polymer): $G' \sim \omega^2$ and $G'' \sim \omega$. This is the typical rheological behavior of a viscous fluid (e.g., a polymer solution or melt). The 10 wt. % sample is an optically transparent gel. The storage modulus is significantly larger than the loss modulus and is frequency independent at low frequencies—characteristic of solid-like behavior. The 4 wt. % sample shows intermediate behavior. Over the entire frequency range of our experiments, we observed similar values and power law dependences for the storage and loss moduli of the 4 wt. % samples: $G' \sim G'' \sim \omega^{0.5}$. This is the signature of the transition between liquid-like and solid-like behavior and closely approximates the gel point (which was calculated to be about 4.9 wt. %). Intermediate power law dependences were observed for 3 wt. %, 5 wt. %, and 7 wt. % samples. These data are not included in FIG. 15 for the sake of clarity.

Example 4

Preparation of
PNIPAm-PEO-PNIPAm/[EMIM][TFSI] Ion Gel

Figure 16:
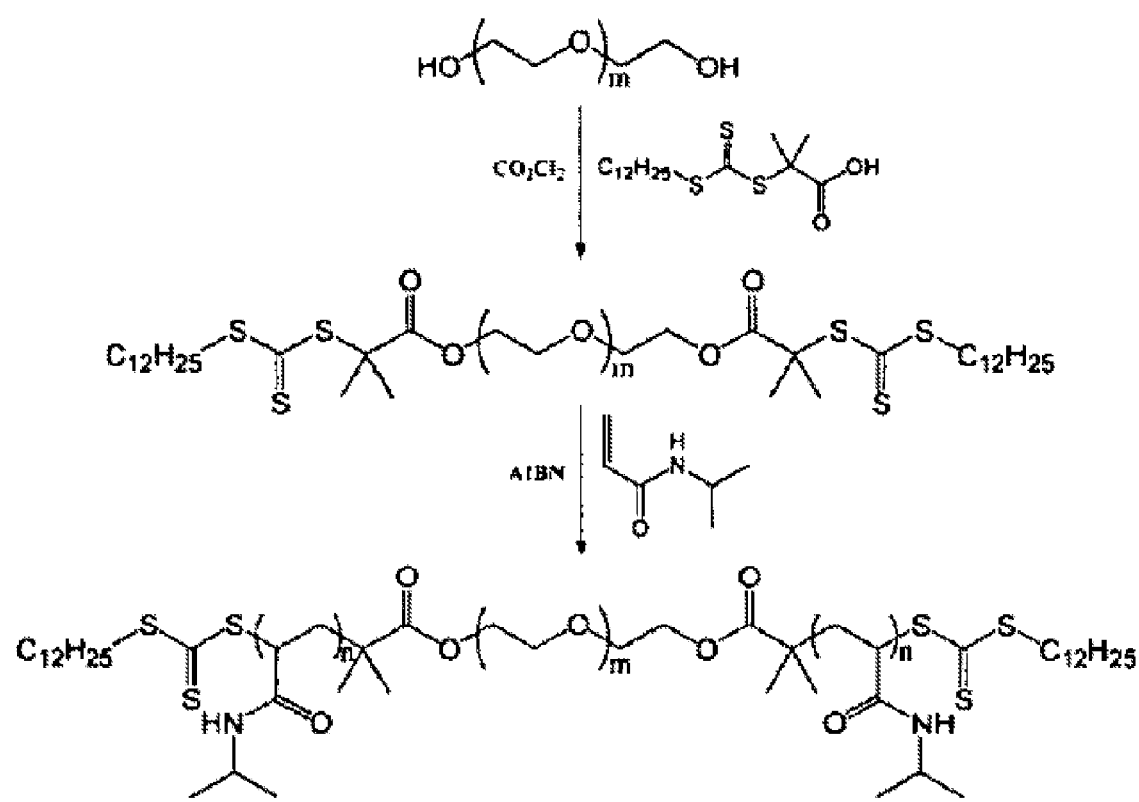
FIG. 16 is a diagram of an exemplary synthesis method for poly(N-isopropyl acrylamide-block-ethylene oxide-block-N-isopropyl acrylamide).

A poly(N-isopropyl acrylamide-block-ethylene oxide-block-N-isopropyl acrylamide) (PNIPAm-PEO-PNIPAm) triblock copolymer was synthesized by reversible addition-fragmentation chain transfer (RAFT) polymerization (FIG. 16) from a telechelic PEO precursor. The hydroxyl endgroups of PEO were coupled to the chain transfer agent (CTA), S-1-dodecyl-S'-(α,α'-dimethyl-α'-acetic acid) trithiocarbonate, via an acid chloride intermediate. CTA endcapped PEO was subsequently used to grow PNIPAm blocks by RAFT polymerization. Each step of the reaction was followed by $^1$H NMR spectroscopy and the product was characterized by size exclusion chromatography (SEC). The final product had an overall number average molecular weight of $M_n$=29 kg mol$^{-1}$ and a polydispersity of $M_w/M_n$=1.16. The two PNIPAm end-blocks have molecular weights of $M_n$=2.8 kg mol$^{-1}$, and the fraction of diblocks (i.e., polymers with only one PNIPAm block) is less than 10%.

The 1-ethyl-3-methylimidazolium bis(trifluoromethylsulfonyl)imide ([EMIM][TFSI]) ionic liquid was prepared following a known synthesis protocol. 1-Ethyl-3-methylimidazolium bromide (EMIM$^+$Br$^-$) was first prepared by the quaternization reaction of 1-methylimidazole with ethyl bromide, followed by repeated recrystallization. Then the anion exchange reaction between EMIM$^+$Br$^-$ and Li$^+$TFSI$^-$ in water yielded a hydrophobic ionic liquid phase. The obtained [EMIM][TFSI] was repeatedly washed with distilled water, vacuum dried, and identified by NMR.

The polymer electrolyte was prepared by directly dissolving 10 wt. % PNIPAm-PEO-PNIPAm in [EMIM][TFSI]. At room temperature the sample is a viscous liquid, which solidifies after cooling and becomes a transparent ion gel. Upon heating to room temperature it becomes a liquid again, and in subsequent cooling-heating cycles we found the gel transition to be reversible.

Example 5

Characterization of
PNIPAm-PEO-PNIPAm/[EMIM][TFSI] Mixtures

Figure 17:
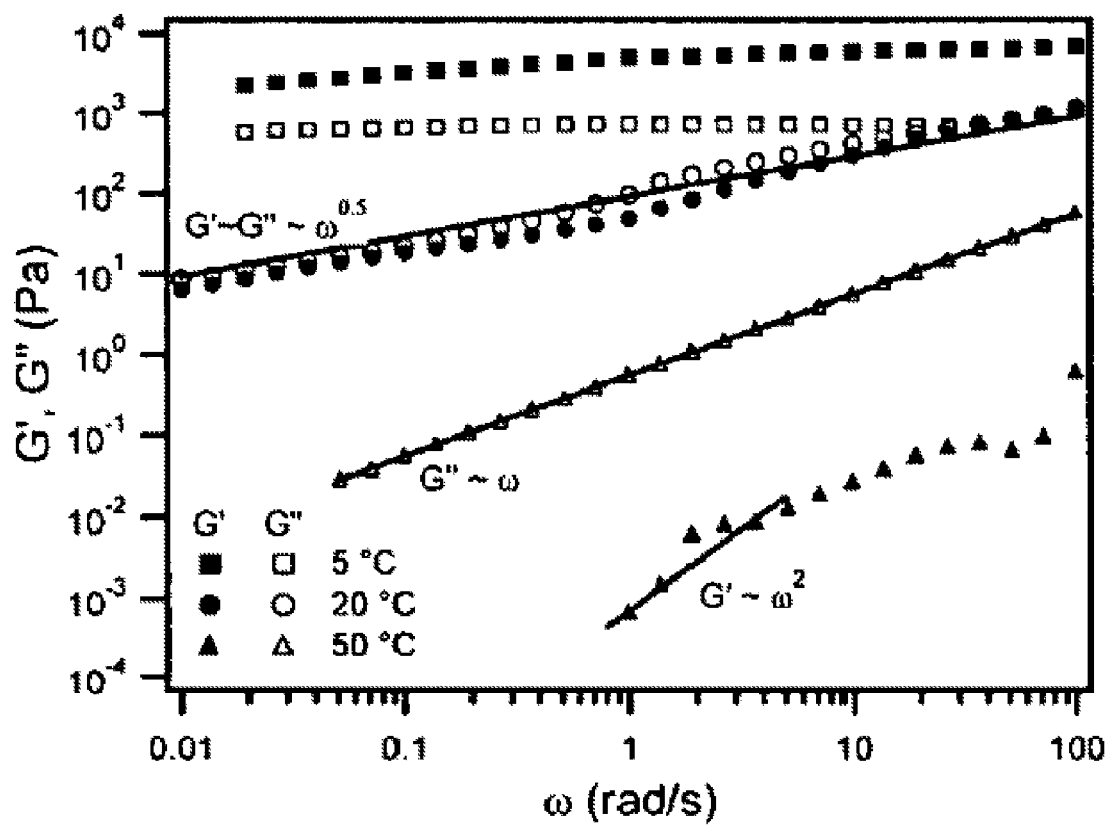
FIG. 17 is a plot of modulus versus angular frequency for an exemplary ion gel.

Dynamic shear measurements were performed on the PNIPAm-PEO-PNIPAm/[EMIM][TFSI] ion gel over the temperature range of 5° C. to 50° C. Representative data at 5° C., 20° C., and 50° C. are shown in FIG. 17. At 50° C. the sample was a liquid. Its dynamic storage modulus (G') was significantly smaller than the loss modulus (G"), and both moduli exhibit different power law dependences on the angular frequency (ω) in the low-frequency window (ωτ<<1, where τ is the longest relaxation time of the polymer): $G' \sim \omega^2$ and $G'' \sim \omega$. This is the typical rheological behavior of a viscous fluid. At 5° C. the sample is an optically transparent gel. G' is larger than G" and is nearly frequency independent—a characteristic of solid-like behavior. At a temperature of 20° C., the sample shows intermediate behavior: over the entire frequency range of experiments we observed similar values and power law dependences for G' and G": $G' \sim G'' \sim \omega^{0.5}$. This is the signature of the transition between liquid-like and solid-like behavior, and closely approximates the gel point. Intermediate power law dependences were observed for other temperatures between 5° C. and 50° C. These data are not included in FIG. 17 for the sake of clarity.

Figure 18:
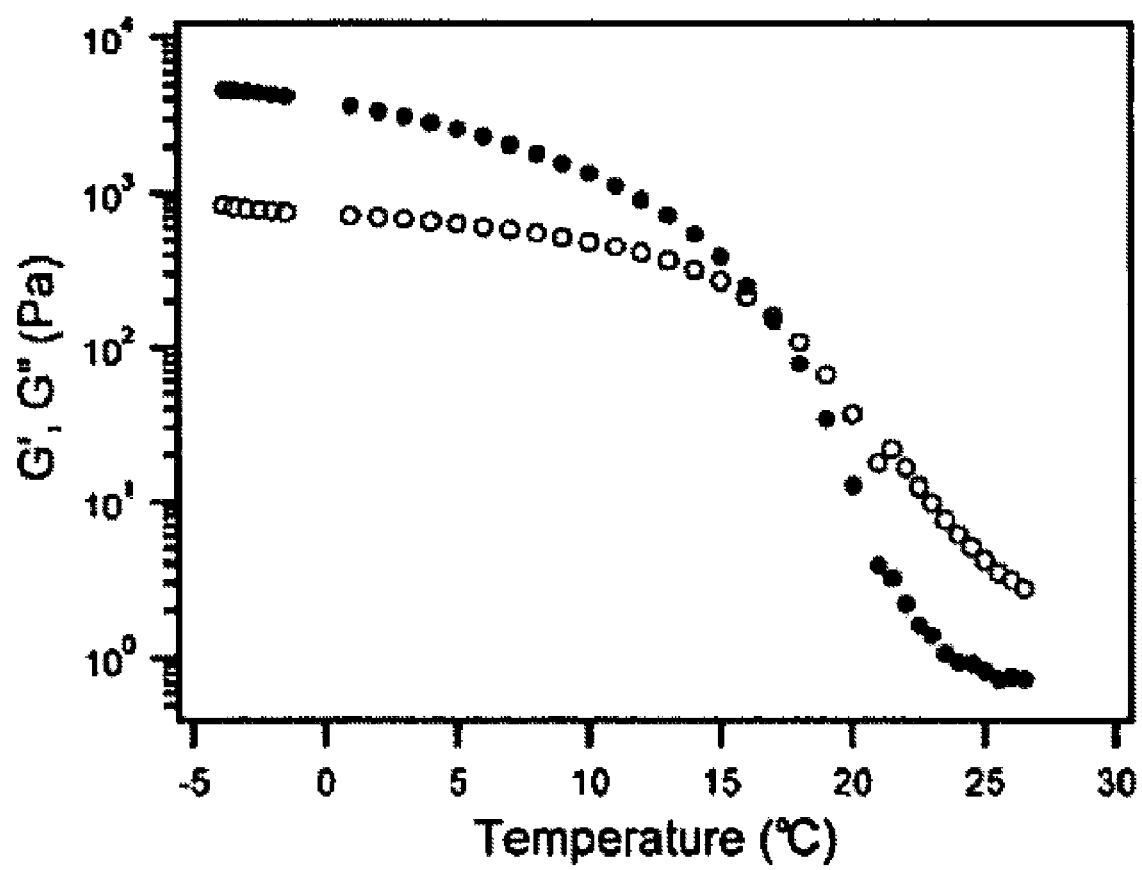
FIG. 18 is a plot of modulus versus temperature for an exemplary ion gel.

A further manifestation of the thermoresponsive gel transition is presented in FIG. 18, in which the temperature dependences of G' and G" were measured at a frequency of 0.1 rad/s during a temperature ramp from −4° C. to 26° C. at a heating rate of 0.5° C./min. FIG. 18 clearly shows that there is a transition for both G' and G" as a function of temperature, with the change in G' approaching four orders of magnitude. The gel transition temperature is around 17° C., consistent with the results in FIG. 17.

Example 6

Conductivity of PNIPAm-PEO-PNIPAm/[EMIM][TFSI]

Figure 19:
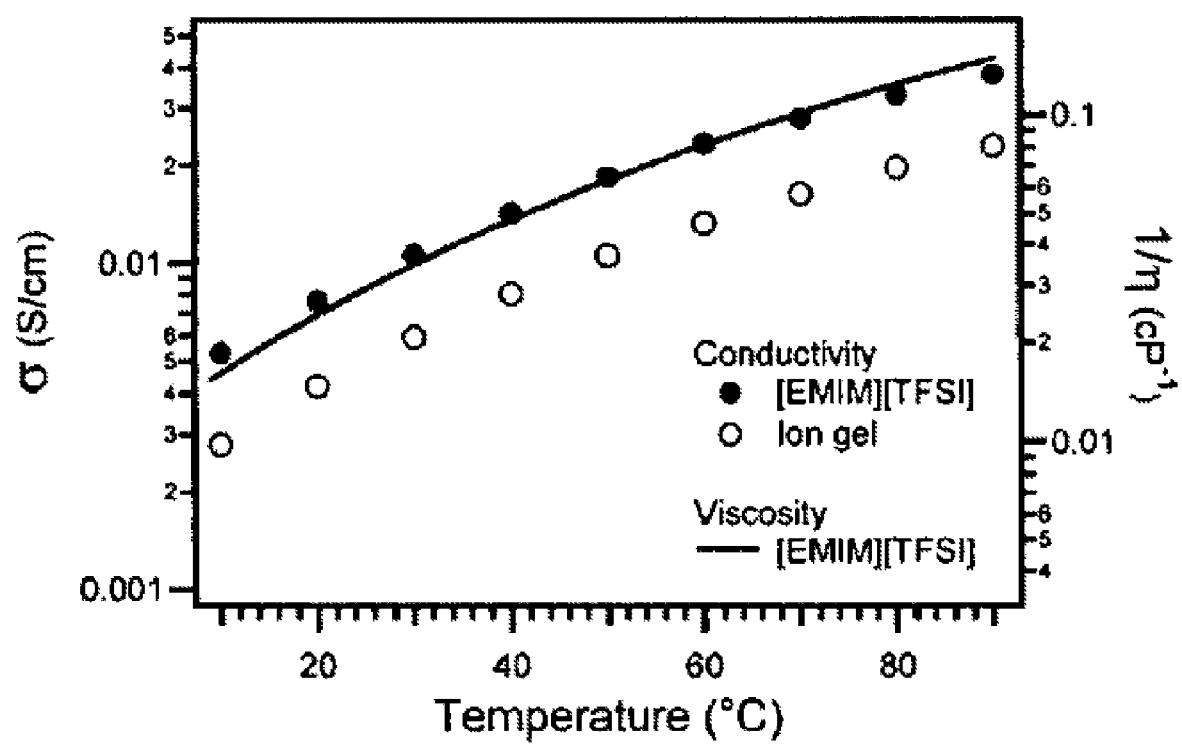
FIG. 19 is a plot of conductivity versus temperature and the reciprocal of the viscosity versus temperature for an exemplary ion gel.

The ionic conductivity of the PNIPAm-PEO-PNIPAm/[EMIM][TFSI] ion gel was also investigated. The σ of neat [EMIM][TFSI] and the PNIPAm-PEO-PNIPAm/[EMIM][TFSI] ion gel were measured over the temperature range of 10° C. to 90° C. by AC impedance measurements. The results are plotted in FIG. 19 along with the reciprocal of the viscosity (η) of neat [EMIM][TFSI] as measured in our laboratory. The temperature dependence of σ varies very little upon gelation. Over the investigated temperature range, the σ of the ion gel was found to be reduced by only about a factor of two from the pure solvent. At room temperature, σ reaches about 5 mS/cm, which is much higher than the S—O—S/[BMIM][PF$_6$] ion gel and also higher than the values of conventional polymer electrolytes.

For both the neat [EMIM][TFSI] and the ion gel, the temperature dependences of σ nearly track the temperature dependence of the inverse η of neat [EMIM][TFSI]. The proportionality between σ and 1/η (Walden's rule) has been observed for a number of ionic liquids. Thus, the viscosity is a good indicator of ionic conductivity and provides an easy way to estimate its temperature dependence. The slight mismatch between the temperature dependences of σ and 1/η is common in many ionic liquids, and is generally attributed to ion pairing.

Example 7

Rheological Testing of PNIPAm-PEO-PNIPAm

Figure 20:
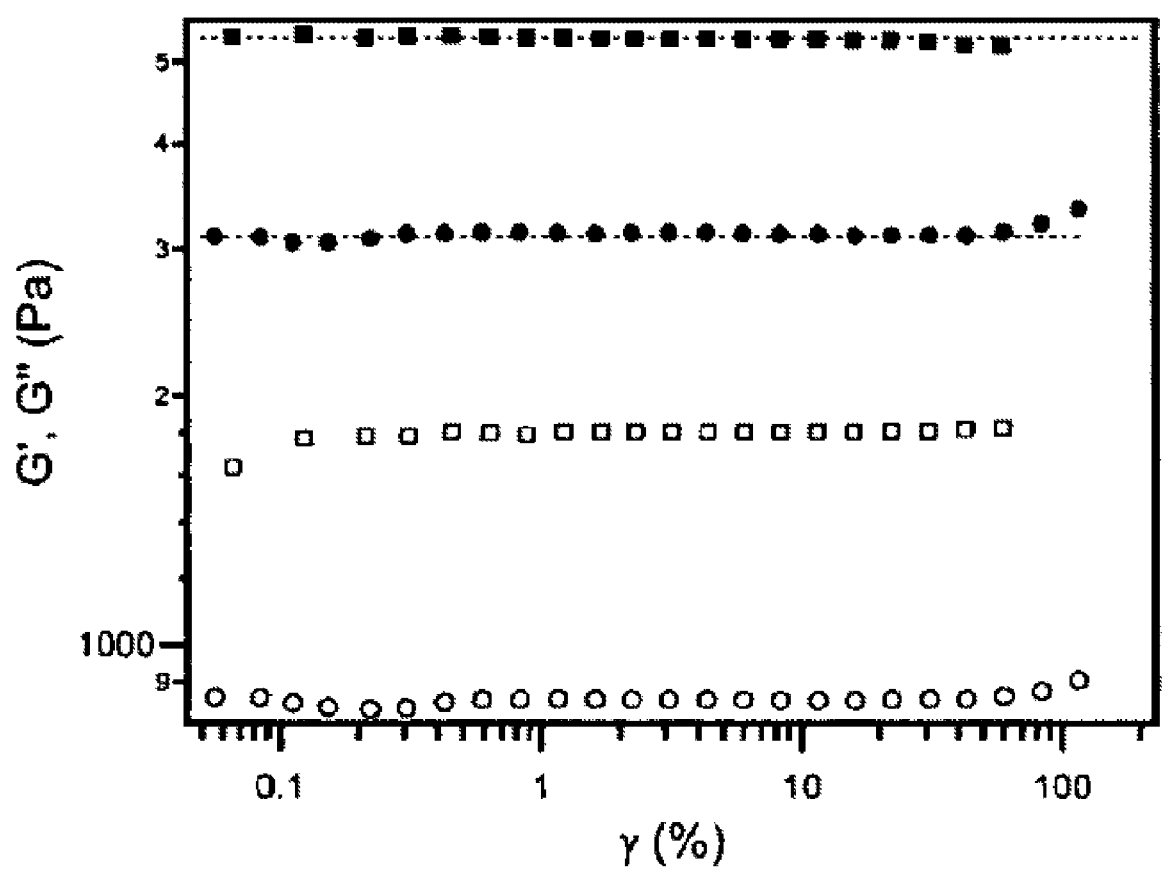
FIG. 20 is a plot of modulus versus strain for an exemplary ion gel.

The rheological response of the PNIPAm-PEO-PNIPAm/[EMIM][TFSI] ion gel under large strains was also investigated. Dynamic strain sweep experiments were conducted on the ion gel over a wide range of strains γ (up to the instrument limit). Representative results measured at two frequencies are provided in FIG. 20. The linear viscoelastic regime is defined as the regime below the critical value $γ_c$ where G' remains invariant with respect to strain. This ion gel has a large $γ_c$ value (>70%), indicating a very strong gel. Even at 100% strain, there is no evidence of break up of the gel microstructure.

Example 8

Preparation of Ion Gels for Transistor Testing

A symmetric poly(styrene-block-ethylene oxide-block-styrene) (PS-PEO-PS) triblock copolymer was purchased from Polymer Source, Inc. (U.S.A.). Its molecular weight ($M_n$) is 34 kg/mol and its polydispersity ($M_w/M_n$) is 1.23, as characterized by gel permeation chromatography based on a PEO standard. The weight fraction of PEO in the copolymer is 75%. 1-butyl-3-methylimidazolium hexafluorophosphate ([BMIM][PF$_6$]), and 1-ethyl-3-methylimidazolium n-octylsulfate ([EMIM][OctSO$_4$]) were purchased from Solvent Innovation GmbH (Germany). 1-ethyl-3-methylimidazolium bis(trifluoromethylsulfonyl)imide ([EMIM][TFSI]) was synthesized according to known synthesis methods. Samples including PS-PEO-PS triblock copolymers in each of the ionic liquids were dissolved in dichloromethane. The dichloromethane was slowly evaporated at the room temperature for about 24 hours and further dried in vacuum over about 2 days. In order to fix the relative amount of ionic liquid in the three different ion gels, about 1.9 ionic liquid molecules per one ether unit in PEO were added.

Example 9

Preparation of Transistors with Ion Gel Layers

Top-gated polymer Thin Film Transistors (TFTs) with Au source/drain top electrodes were fabricated using the three different ion gels described in Example 8 as gate dielectrics and a regioregular poly-3-hexylthiophene (P3HT) semiconductor layer. The device had a channel length of 20 μm and channel width of 200 μm.

Poly-3-hexylthiophene (P3HT), purified by successive Soxhlet extractions with methanol, acetone, and hexane, was spin-coated from a regioregular P3HT/1,2-dichlorobenzene solution (3 mg/mL) onto a SiO$_2$/Si substrate to a thickness of about 20 nm. On top of the P3HT layer, 35 μm thick Au source and drain contacts were deposited through a silicon stencil mask to define a channel length of 20 μm and a channel width of 200 μm. The ion gel was pasted by hand over the channel region, and then the gate contact was prepared by laminating a polyester-supported 400 μm-wide copper strip to the top of the gel overlapping the source and drain electrodes.

Example 10

C-V Characterization of Ion Gels

Figure 21:
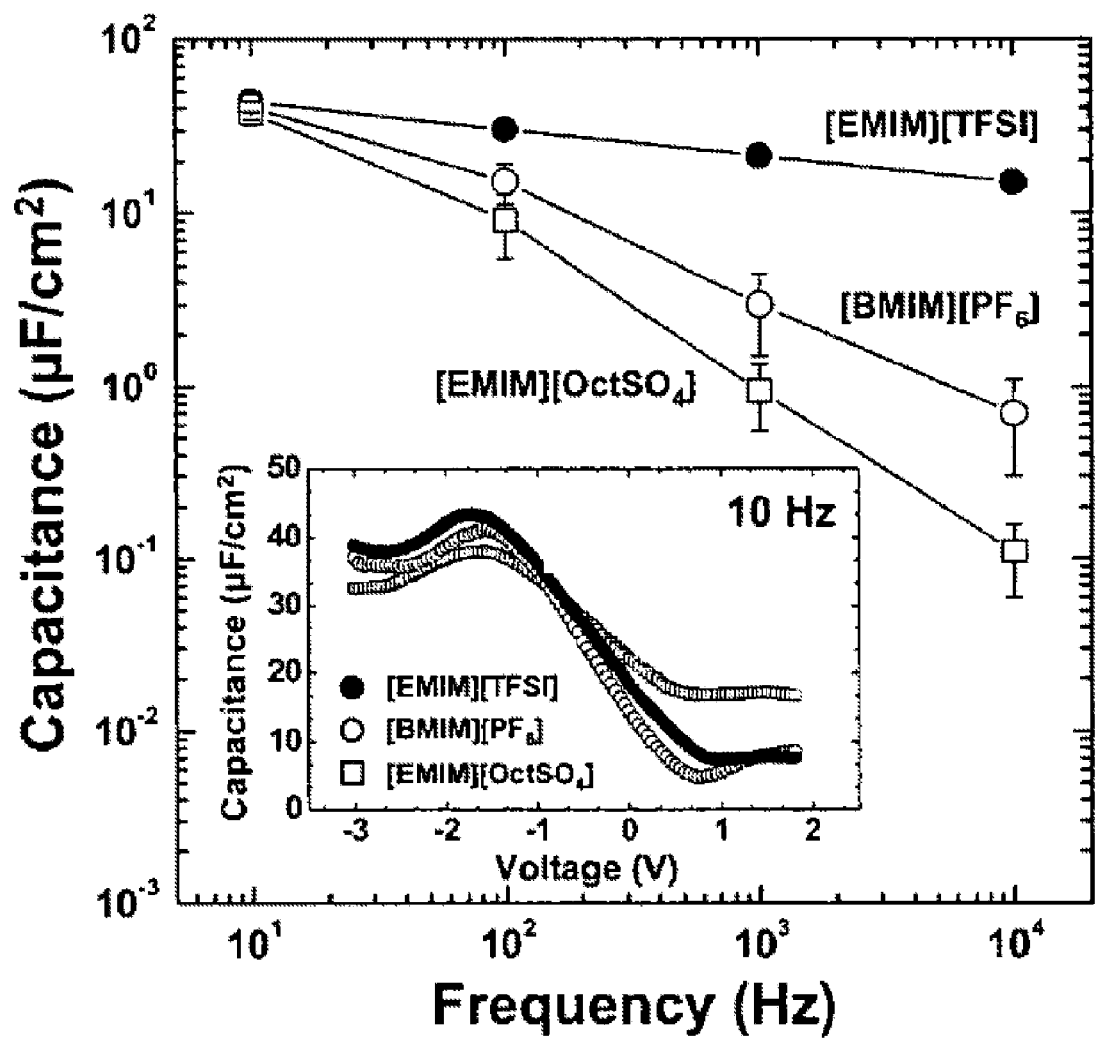
FIG. 21 is a plot of capacitance versus frequency and capacitance versus voltage for an exemplary ion gel capacitor.

The capacitance-voltage (C-V) measurement of the ion gels prepared in Example 8 was carried out on metal-insulator-semiconductor (MIS) structures using a HP 4192A LF impedance analyzer as a function of frequency (from 10 to $10^4$ Hz). A 120 μm-thick ion gel layer was sandwiched between p-type silicon (<100> orientation, 25 cm) and a laminated top copper contact (~4×10$^{-3}$ cm$^2$). FIG. 21 shows C-V curves at 10 Hz and the frequency dependence of the capacitance for ion gels based on the three ionic liquids. The capacitance for the MIS structure increases upon sweeping the bias applied to the top copper contact from positive to negative voltages because holes in the p-Si are depleted at the gel-Si interface at positive bias and accumulate for negative bias (inset of FIG. 21). Maximum capacitance values are found to be 43 μF/cm$^2$, 41 μF/cm$^2$, and 38 μF/cm$^2$ for the [EMIM][TFSI], [BMIM][PF$_6$], and [EMIM][OctSO$_4$] ion gels, respectively, at 10 Hz, far greater than that of typical inorganic or organic dielectric materials. A 150 nm thick layer of SiO$_2$, for example, has a capacitance of 20 nF/cm$^2$. The capacitance of the ion gels decreases with the frequency as expected. However, the degree of change directly depends on the ionic conductivity: 43 μF/cm$^2$ to 15 μF/cm$^2$ for the [EMIM][TFSI] ion gel, 41 μF/cm$^2$ to 0.7 μF/cm$^2$ for the [BMIM][PF$_6$] ion gel, and 38 μF/cm$^2$ to 0.1 μF/cm$^2$ for the

[EMIM][OctSO$_4$] ion gel. While not wishing to be bound by any theory, a suspected reason for this greater decrease in capacitance is because for ion gels with low ionic conductivity the polarization within the ion gel gate dielectric cannot follow the AC voltage swing at high frequency.

Example 11

I-V Characterization of Ion Gel-Gated TFTs

FIG. 22A shows the output characteristics of an S—O—S/[EMIM][TFSI]-based ion gel-gated thin film transistor (IG-TFT) at six different values of the gate voltage ($V_G$). The output characteristics show a clear field effect induced by $V_G$. The drain current ($I_D$) shows linear behavior at low drain biases ($V_D$) that are much lower than $V_G$, while saturation behavior is found in the high bias regime. The saturation current was greater than 600 µA at $V_G$=−3 V and $V_D$=−1 V, which results from the large capacitance of ion gel gate dielectric. IG-TFT devices based on [BMIM][PF$_6$], and [EMIM][OctSO$_4$] also show very similar output characteristics (not shown).

FIGS. 22B, 22C, and 22D show the ID and the gate current (IG) as a function of gate voltage for [EMIM][TFSI], [BMIM][PF$_6$], and [EMIM][OctSO$_4$] P3HT IG-TFTs, and Table 1 summarizes the parameters of the IG-TFT device performance. The parameters were measured simultaneously while sweeping from +1 V to −3 V (forward) and back at a rate of 75 mV/s. From the transfer characteristics of more than 10 devices, average field-effect mobilities were calculated in the saturation regime ($V_D$=−1 V). The average field-effect mobilities are all about 1 cm$^2$/Vs for [EMIM][TFSI], [BMIM][PF$_6$], and [EMIM][OctSO$_4$] IG-FETs. The on/off current ratios of [EMIM][TFSI], and [BMIM][PF$_6$] based IG-FETs are about 10$^5$ and that of [EMIM][OctSO$_4$] based IG-FETs is about 10$^4$. Turn on voltage increases negatively from −0.7 to −1.2 V with decreasing ionic conductivity of the ion gel. The $I_G$ is three orders of magnitude lower than ID except the [EMIM][OctSO$_4$] based IG-TFT, which has a higher off current level.

$I_G$-$V_G$ curves in FIGS. 22B-D show negative and positive peaks corresponding to the injection and subsequent removal of holes during the forward and reverse sweeps, respectively. [EMIM][OctSO$_4$] based IG-TFTs also show clear negative and positive peaks in the $I_G$-$V_G$ curve, although a higher amount of leakage current is observed. The injected and removed charge carrier density was calculated by integrating the displacement current versus time data, similar to the analysis of a cyclic voltammogram. The integrated areas in forward and reverse sweeps of the $I_G$-$V_G$ curves correspond to hole densities of about 5×10$^{14}$ charges/cm$^2$ for [EMIM][TFSI], [BMIM][PF$_6$], and [EMIM][OctSO$_4$] IG-TFTs. Importantly, the integrated peak areas in the forward and reverse sweep of the $I_G$-$V_G$ curves are approximately equal, which indicates that the injected holes are subsequently removed.

Example 12

Transient Response of IG-TFTs to 1 Hz and 1 kHz Input Signals

Figure 23A:
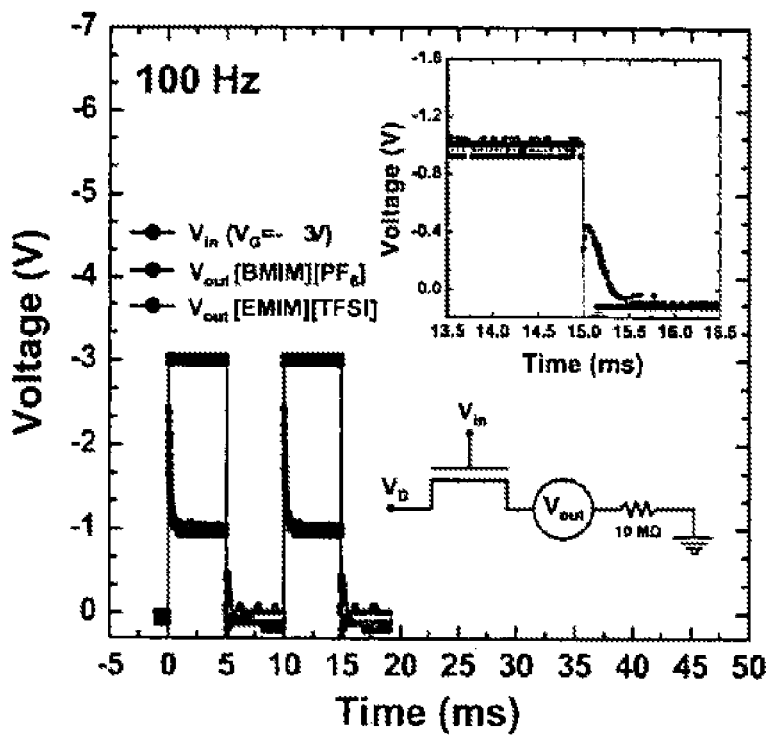
FIGS. 23A and B are plots of transient voltage response for three exemplary IG-FETs.
Figure 23B:
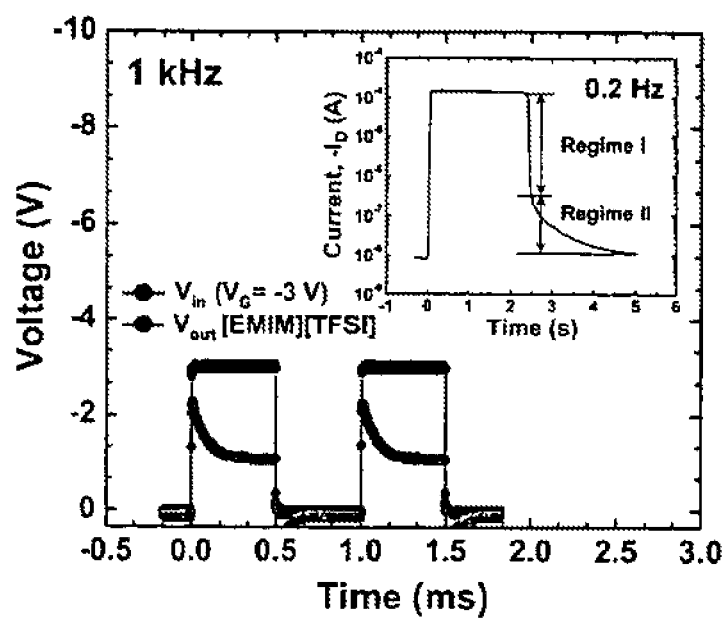

The transient response of [BMIM][PF$_6$] and [EMIM][TFSI] based transistors to a 100 Hz square-wave $V_G$ input is shown in FIG. 23A. In both cases, the output voltage ($V_{out}$) of the IG-TFT tracks the trace of the input gate signal, though there is some distortion of the output waveform due to short-lived capacitive displacement. The [BMIM][PF$_6$] P3HT IG-TFT turns off slowly. The response time is approximately 0.5 ms when switching from ON to OFF. However, that of [EMIM][TFSI] P3HT IG-TFT is below 0.1 ms as shown in the inset of FIG. 23A, which is thought to be due to the higher ionic conductivity of [EMIM][TFSI]. Furthermore, the [EMIM][TFSI] P3HT IG-TFT can be operated even at 1 kHz (FIG. 23B), which is much faster than those previously reported for solid polymer electrolyte-based TFTs. On the other hand, for [EMIM][OctSO$_4$] P3HT IG-TFTs, 1 Hz was the maximum operating frequency (the transient response plot is not shown). The low operating frequency of [EMIM][OctSO$_4$] P3HT IG-TFTs again supports the argument that the ionic conductivity has a marked impact on the maximum operating frequency.

Example 13

Fabrication of Ion Gel TFTs using Various Organic Semiconductors

Poly-3-hyxylthiophene (P3HT) was purchased from Rieke Metals, Inc; poly(3,3'''-didodecylquaterthiophene) (PQT-12) and poly(9,9'-dioctylfluorene-co-bithiophene) (F8T2) were purchased from American Dye Source, Inc. P3HT and PQT-12 were purified by successive Soxhlet extractions with methanol, acetone, and hexane, while F8T2 was used as received. 1,2-dichlorobenzene solutions (3 mg/mL) of P3HT and PQT-12, and xylene solutions (3 mg/mL) of F8T2 were prepared in a glove box. A symmetric poly(styrene-block-ethylene oxide-block-styrene) (PS-PEO-PS) triblock copolymer with a molecular weight ($M_n$) of 34 kg/mol and a polydispersity ($M_w/M_n$) of 1.23 was purchased from Polymer Source, Inc. The weight fraction of PEO was 0.72. 1-ethyl-3-methylimidazolium bis(trifluoromethylsulfonyl)imide ([EMIM][TFSI]) was synthesized, by a known technique. PS-PEO-PS triblock copolymers and ionic liquids were dissolved in acetonitrile at a concentration of 10% by weight in the glove box. About 1.9 ionic liquid molecules per PEO monomer were added. All materials used in this study were stored in the glove box before use.

TABLE 1

Characteristics of IG-TFTs Utilizing Three Ionic Liquids

| Ionic liquid | Ionic Conductivity of Ion Gel (mS/cm) | Field-effect Mobility (cm$^2$/V · s) | On/Off Current Ratio | Turn On Voltage (V) (±0.2) | Maximum Operating Frequency (Hz) |
|---|---|---|---|---|---|
| [EMIM][TFSI] | 7.6 | 1.1 (±0.9) | ~10$^5$ | −0.7 | ~1000 |
| [BMIM][PF$_6$] | 1.1 | 1.0 (±0.8) | ~10$^5$ | −0.8 | ~100 |
| [EMIM][OctSO$_4$] | 0.26 | 1.2 (±0.9) | ~10$^4$ | −1.2 | ~1 |

Ion gel-gated polymer TFTs were prepared using Si/SiO$_2$ wafers as substrates. On top of the substrate, 35 nm thick Au source and drain contacts were deposited through a silicon stencil mask to define a channel length of 20 µm and a channel width of 100 µm. In the case of the integrated circuit of LED and IG-TFT, a mask with a channel length of 20 µm and a channel width of 1000 µm was used to increase the on current level. The polymer semiconductor layer was spin coated on the Au patterned Si wafer in the glove box (film thickness~20 nm). The spun polymer semiconductor films were dried for 1 day under vacuum at about 10$^{-6}$ Torr. The ion gel solution was then drop cast directly onto the dried polymer semiconductor film with source and drain electrodes and allowed to dry under vacuum at about 10$^{-6}$ Torr for over 2 days. After that, alignment of a second silicon stencil mask to the transistor channel was followed by vacuum evaporation of 50 nm thick Au to form the gate contact. Commercially available LEDs with a wavelength of about 660 nm (#276-307) were purchased from RadioShack. Maximum voltage and current are 2.4 V and 20 mA, respectively. An anode of LED and drain of IG-TFT were connected with silver paint.

Example 14

Aerosol Printing of Ion Gel

Ion gel was printed using a procedure available from Optomec, Inc., (St. Paul, Minn.) under the trade designation Aerosol Jet. The ion gel solution with the same concentration as that of Example 13 was used. Rectangular shaped patterns of ion gel were formed by parallel, adjacent traces of ink with 100 µm separation between traces. The patterns have widths of 300 µm, lengths of 1000 µm, and thicknesses of 5 µm. They were aligned relative to P3HT-coated source and drain electrodes using an optical camera alignment system. The electrodes were located using the optical camera and then the substrate was translated a calibrated distance to the print head. In order to minimize the volume shrinkage during solvent evaporation, the substrate temperature was maintained at 60° C. Thus, the acetonitrile evaporated right after printing. Samples were allowed to dry under vacuum at about 10$^{-6}$ Torr for over 2 days. Finally, alignment of a silicon stencil mask to the transistor channel was followed by vacuum evaporation of 50 nm thick Au to form a gate contact.

Example 15

I-V Characteristics of IG-TFTs with P3HT, PQT-12 and F8T2

Semiconductor Layers

FIGS. 24A, 24B, and 24C show the drain current ($I_D$) as a function of gate voltage ($V_G$) for P3HT, PQT-12, and F8T2-based transistors, respectively. Table 2 summarizes the parameters of device performance. The $I_D$-$V_G$ characteristics were measured by sweeping from 0 to −4.5 V (forward) and back at a rate of 50 mV/s. The average field-effect mobilities are 1.8, 1.6, and 0.8 cm2/Vs for P3HT, PQT-12, and F8T2-based IG-TFTs, respectively. The ON/OFF current ratios of P3HT and PQT-12-based IG-TFTs are about 10$^5$ and that of F8T2-based IG-TFTs is about 10$^4$. The turn on voltages of P3HT and PQT-12-based IG-TFTs are about −2.7 V and that of F8T2-based IG-TFTs is about −3.4 V. The high performance of IG-TFTs using three representative polymer semiconductors suggests that the ion gel films can be applicable in other polymer semiconductors for the improved TFT performance.

TABLE 2

Characteristics of IG-TFTs Utilizing Three Polymer Semiconductors

| Polymer Semiconductor | Field-effect mobility (cm$^2$/V · s) | ON/OFF current ratio | Turn on voltage (V) (±0.1) |
|---|---|---|---|
| P3HT | 1.8 (±0.7) | ~10$^5$ | −2.7 |
| PQT-12 | 1.6 (±0.8) | ~10$^5$ | −2.7 |
| F8T2 | 0.8 (±0.3) | ~10$^4$ | −3.4 |

Example 16

LED Device Operation

LED device operation was realized by wiring an inorganic red LED with the P3HT-based IG-TFT. An anode of LED and drain of IG-TFTs were connected with silver paint. The light emission of LED is detected by a photodetector above the LED at a 5 mm distance. FIG. 25A shows LED current ($I_{LED}$) and optical power as a function of the gate voltage of GEL-OTFTs at the LED voltage ($V_{LED}$)=−2 V. The $V_{LED}$ was chosen because the turn on voltage of the LED is −1.7 V. To increase the amount of injected current, the channel with an aspect ratio of 50 was used (channel length of 20 µm, and width of 1000 µm). The turn on voltage of the integrated circuit is around −3 V. After the turn on voltage, optical power dramatically increases with the gate bias, as expected from the transfer characteristics of IG-TFTs. At the gate voltage of as low as −4 V, the LED current was about 0.5 mA and the optical power reaches almost 0.1 mW. The ON/OFF ratio of optical power is about 10$^5$. The injected current is proportional to the LED brightness as shown in FIG. 25B. For comparison, in the case of typical Organic TFTs using SiO$_2$ gate dielectrics, the maximum output optical power would be only about 0.001 mW, and thus the contrast ratio of optical power would be only 10$^3$ due to a current level of less than 10$^{-5}$ A, even at a high gate voltage of −70 V. Therefore, this experiment clearly demonstrates that IG-TFTs may generate a high amount of current at low biases to efficiently operate LEDs with high brightness.

Example 17

Response of IG-TFTs to 10 kHz Input Signal

We further investigated the transfer characteristics and transient response at 10 kHz of IG-TFTs with nonaligned gate electrodes. The gate electrode was located approximately 50 µm away as seen the inset of FIG. 26A. The nonaligned IG-TFTs still show similar device characteristics in spite of the position of the gate electrode, as shown in FIG. 26A. However, the maximum drain current in the transfer characteristics is slightly lower than that of an IG-TFT with the vertically aligned gate electrode, which is due to the relatively lower induced charges in the channel region. In the case of the transient response of the nonaligned IG-TFT, it also tracks a 10 kHz input signal as shown in FIG. 26B. The behavior is almost indistinguishable from vertically aligned IG-TFTs. These experiments demonstrate that the device behavior was robust with respect to the alignment of the gate electrode, and the issue of gate alignment in printed organic electronics can be overcome with the ion gel film gate dielectrics.

Figure 27A:
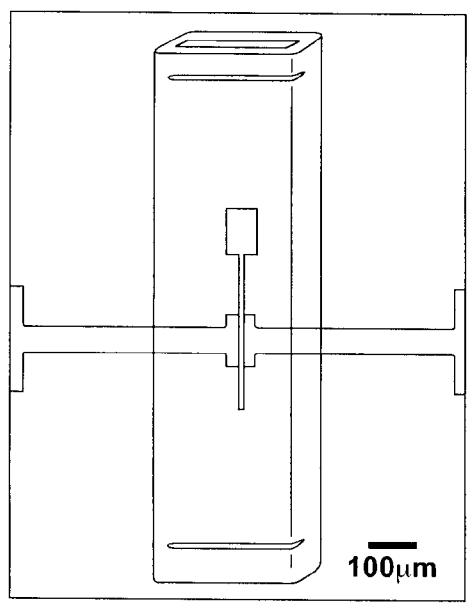
FIG. 27A is an optical micrograph of an exemplary printed IG-FET.
Figure 27B:
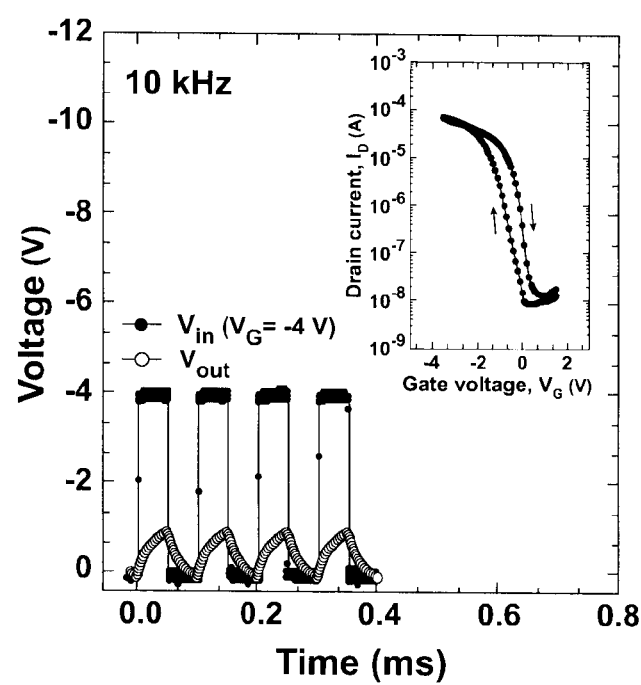
FIG. 27B is a transient response plot for an exemplary printed IG-FET such as the IG-FET pictured in FIG. 27A.

Ion gel was also printed on the channel region with an aerosol printing method, as described in Example 14. The pattern, shown in FIG. 27A, had widths of 300 µm and lengths of 1000 µm. The inset of FIG. 27B shows $I_D$-$V_G$ characteristics of the aerosol printed ion gel gated P3HT-based IG-TFT. The average field-effect mobility was $0.8\pm0.4$ cm$^2$ Vs. The ON/OFF current ratio was greater than $10^4$. Note that the turn on voltage is about 0 V compared to −2.7 V for P3HT-based IG-TFTs with drop cast ion gel film, which may be due to the structural difference between drop cast and aerosol printed ion gel films. Compared to the aerosol printing, solution casting allows sufficient time to form a stable state because solvent evaporates slowly. Thus, hydrophobic PS part can be segregated onto hydrophobic P3HT surface, which might induce the delayed turn on. The P3HT-based IG-TFT with an aerosol printed ion gel gate dielectric also tracks a 10 kHz input signal as shown in FIG. 27B. Based on these measurements, ion gel gate dielectrics can be printed and the electrical performance of printed ion gel-based IG-TFTs is similar to that of the drop cast ion gel-based IG-TFTs.

Various embodiments of the invention have been described. These and other embodiments are within the scope of the following claims.

We claim:

1. An ion gel comprising:
   an ionic liquid; and
   a block copolymer comprising at least three blocks, wherein the block copolymer forms a self-assembled polymer network in the ionic liquid, and wherein the ion gel comprises less than 10 wt. % block copolymer.

2. The ion gel of claim 1, wherein the block copolymer comprises at least two A blocks and a B block.

3. The ion gel of claim 2, wherein the block copolymer comprises two A blocks and a B block in an A-B-A arrangement.

4. The ion gel of claim 1, wherein the block copolymer comprises three A blocks and two B blocks in an A-B-A-B-A arrangement.

5. The ion gel of claim 2, wherein the A block comprises a low polarity polymer that is substantially insoluble in the ionic liquid.

6. The ion gel of claim 2, wherein the A block is at least partially glassy at room temperature.

7. The ion gel of claim 2, wherein the B block is compatible with the ionic liquid.

8. The ion gel of claim 2, wherein the A block comprises at least one of polystyrene and poly(N-isopropyl acrylamide), and the B block comprises at least one of poly(methylmethacrylate), poly(ethyl acrylate), and poly(ethylene oxide).

9. The ion gel of claim 3, wherein the block copolymer comprises poly(styrene-block-ethylene oxide-block-styrene).

10. The ion gel of claim 3, wherein the block copolymer comprises poly(N-isopropyl acrylamide-block-ethylene oxide-block-N-isopropyl acrylamide).

11. The ion gel of claim 1, wherein the self-assembled ion gel is thermoreversible.

12. The ion gel of claim 1, wherein the ionic liquid is selected from the group consisting of [BMIM][PF$_6$], [EMIM][TFSI], and [EMIM][OctSO$_4$].

13. The ion gel of claim 1, wherein the ion gel comprises about 4 wt. % to about 5 wt. % block copolymer.

14. A method of forming an ion gel comprising:
   forming a block copolymer comprising at least three blocks; and
   depositing less than 10 wt. % of the block copolymer in an ionic liquid, wherein the block copolymer forms a self-assembled polymer network in the ionic liquid.

15. The method of claim 14, wherein the ion gel is thermoreversible, the method further comprising:
   raising the temperature of the ion gel above an upper critical solution temperature of the ion gel to form a liquid solution;
   processing the liquid solution; and
   cooling the liquid solution to below the upper critical solution temperature to reform the ion gel.

16. The method of claim 14, wherein the block copolymer comprises poly(styrene-block-ethylene oxide-block-styrene).

17. The method of claim 14, wherein the block copolymer comprises poly(N-isopropyl acrylamide-block-ethylene oxide-block-N-isopropyl acrylamide).

18. The method of claim 15, wherein the block copolymer comprises poly(N-isopropyl acrylamide-block-ethylene oxide-block-N-isopropyl acrylamide).

19. The method of claim 14, wherein the ionic liquid is selected from the group consisting of [BMIM][PF$_6$], [EMIM][TFSI], and [EMIM][OctSO$_4$].

20. The method of claim 14, wherein depositing the block copolymer in the ionic liquid comprises depositing about 4 wt. % to about 5 wt. % of the block copolymer in the ionic liquid.

21. A thermoreversible ion gel comprising:
   an ionic liquid; and
   a self-assembled polymer network comprising a polymer, wherein the polymer comprises at least three blocks, wherein the self-assembled polymer network is formed when a mixture of the ionic liquid and the polymer is below an upper critical solution temperature of the mixture, and wherein the self-assembled polymer network disassembles when the mixture is above the upper critical solution temperature of the mixture.

22. The ion gel of claim 21, wherein the polymer comprises at least two A blocks and a B block.

23. The ion gel of claim 22, wherein the polymer comprises two A blocks and a B block in an A-B-A arrangement.

24. The ion gel of claim 21, wherein the ionic liquid is selected from the group consisting of [BMIM][PF$_6$], [EMIM][TFSI], and [EMIM][OctSO$_4$].

25. The ion gel of claim 21, wherein the polymer comprises at least five blocks.

26. The ion gel of claim 25, wherein the polymer comprises three A blocks and two B blocks in an A-B-A-B-A arrangement or two A blocks, one B block, and two C blocks in an A-C-B-C-A arrangement.

27. The ion gel of claim 21, wherein the B block is compatible with the ionic liquid.

28. The ion gel of claim 24, wherein the A block comprises poly(N-isopropyl acrylamide).

29. The ion gel of claim 24, wherein the B block comprises poly(ethylene oxide).

30. The ion gel of claim 21, wherein the polymer comprises poly(N-isopropyl acrylamide-block-ethylene oxide-block-N-isopropyl acrylamide).

31. The ion gel of claim 21, wherein the ion gel comprises less than 10 wt. % block copolymer.

32. The ion gel of claim 25, wherein the ion gel comprises poly(N-isopropyl acrylamide-block-styrene-block-ethylene oxide-block-styrene-block-N-isopropyl acrylamide).

33. An ion gel comprising:
   an ionic liquid; and
   a block copolymer comprising at least five blocks, wherein the block copolymer forms a self-assembled polymer network in the ionic liquid.

34. The ion gel of claim 33, wherein the block copolymer comprises three A blocks and two B blocks in an A-B-A-B A arrangement.

35. The ion gel of claim 34, wherein the A block comprises a low polarity polymer that is substantially insoluble in the ionic liquid.

36. The ion gel of claim 34, wherein the A block is at least partially glassy at room temperature.

37. The ion gel of claim 34, wherein the B block is compatible with the ionic liquid.

38. The ion gel of claim 34, wherein the A block comprises at least one of polystyrene and poly(N-isopropyl acrylamide), and the B block comprises at least one of poly(methylmethacrylate), poly(ethyl acrylate), and poly(ethylene oxide).

39. The ion gel of claim 34, wherein the block copolymer comprises poly(styrene-block-ethylene oxide-block-styrene-block-ethylene oxide-block-styrene).

40. The ion gel of claim 34, wherein the block copolymer comprises poly(N-isopropyl acrylamide-block-ethylene oxide-block-N-isopropyl acrylamide-block-ethylene oxide-block-N-isopropyl acrylamide).

41. The ion gel of claim 34, wherein the block copolymer comprises poly(N-isopropyl acrylamide-block-styrene-block-ethylene oxide-block-styrene-block-N-isopropyl acrylamide).

42. The ion gel of claim 33, wherein the self-assembled polymer network is thermoreversible.

43. The ion gel of claim 33, wherein the ionic liquid is selected from the group consisting of [BMIM][$PF_6$], [EMIM][TFSI], and [EMIM][$OctSO_4$].

44. The ion gel of claim 33, wherein the ion gel comprises less than 10 wt. % block copolymer.

45. The ion gel of claim 1, wherein the block copolymer comprises two A blocks, one B block, and two C blocks in an A-C-B-C-A arrangement.

46. The ion gel of claim 45, wherein the block copolymer comprises poly(N-isopropyl acrylamide-block-styrene-block-ethylene oxide-block-styrene-block-N-isopropyl acrylamide).

47. The ion gel of claim 2, wherein the A blocks comprise at least one of polystyrene, poly(N-isopropyl acrylamide), polybutadiene, polyisoprene, polyethylene, polydimethylsiloxane, or polyisobutylene.

48. The ion gel of claim 2, wherein the A block comprises poly(N-isopropyl acrylamide).

49. The ion gel of claim 3, wherein the B block comprises at least one of poly(methylmethacrylate), poly(ethylene oxide), or poly(ethyl acrylate).

50. The ion gel of claim 2, wherein the B block has a $T_g$ of about −53° C.

51. The ion gel of claim 2, wherein the B block has a molecular weight between about 10,000 g/mol and about 100,000 g/mol.

52. The ion gel of claim 51, wherein each of the A blocks has a molecular weight between about 2,000 g/mol and about 20,000 g/mol.

53. The ion gel of claim 2, wherein the B block has a molecular weight between about 20,000 g/mol and about 50,000 g/mol.

54. The ion gel of claim 53, wherein each of the A blocks has a molecular weight between about 5,000 g/mol and about 10,000 g/mol.

55. The ion gel of claim 2, wherein each of the A blocks has a molecular weight between about 2,000 g/mol and about 20,000 g/mol.

56. The ion gel of claim 2, wherein each of the A blocks has a molecular weight between about 5,000 g/mol and about 10,000 g/mol.

57. The ion gel of claim 1, wherein the block copolymer has a molecular weight between about 14,000 g/mol and about 140,000 g/mol.

58. The method of claim 15, wherein forming the block copolymer comprising at least three blocks comprises forming a block copolymer with at least two A blocks and at least one B block in an A-B-A configuration.

59. The method of claim 58, wherein the A blocks comprise at least one of polystyrene, poly(N-isopropyl acrylamide), polybutadiene, polyisoprene, polyethylene, polydimethylsiloxane, or polyisobutylene.

60. The method of claim 59, wherein the A block comprises poly(N-isopropyl acrylamide).

61. The method of claim 58, wherein the B block comprises at least one of poly(methylmethacrylate), poly(ethylene oxide), or poly(ethyl acrylate).

62. The method of claim 15, wherein forming the block copolymer comprising at least three blocks comprises forming a block copolymer with at least three A blocks and at least two B blocks in an A-B-A-B-A configuration.

63. The method of claim 62, wherein the A blocks comprise at least one of polystyrene, poly(N-isopropyl acrylamide), polybutadiene, polyisoprene, polyethylene, polydimethylsiloxane, or polyisobutylene.

64. The method of claim 62, wherein the B block comprises at least one of poly(methylmethacrylate), poly(ethylene oxide), or poly(ethyl acrylate).

65. The method of claim 15, wherein forming the block copolymer comprising at least three blocks comprises forming a block copolymer with at least two A blocks, at least one B block, and at least two C blocks in an A-C-B-C-A configuration.

66. The method of claim 65, wherein the at least two A blocks comprise poly(N-isopropyl acrylamide), wherein the at least one B block comprises poly(ethylene oxide), and wherein the at least two C blocks comprise polystyrene.

67. The ion gel of claim 22, wherein the B block has a molecular weight between about 10,000 g/mol and about 100,000 g/mol.

68. The ion gel of claim 67, wherein each of the A blocks has a molecular weight between about 2,000 g/mol and about 20,000 g/mol.

69. The ion gel of claim 22, wherein the B block has a molecular weight between about 20,000 g/mol and about 50,000 g/mol.

70. The ion gel of claim 69, wherein each of the A blocks has a molecular weight between about 5,000 g/mol and about 10,000 g/mol.

71. The ion gel of claim 22, wherein each of the A blocks has a molecular weight between about 2,000 g/mol and about 20,000 g/mol.

72. The ion gel of claim 22, wherein each of the A blocks has a molecular weight between about 5,000 g/mol and about 10,000 g/mol.

73. The ion gel of claim 21, wherein the block copolymer has a molecular weight between about 14,000 g/mol and about 140,000 g/mol.

74. The ion gel of claim 21, wherein the ion gel comprises about 4 wt. % to about 5 wt. % block copolymer.

75. The ion gel of claim 33, wherein the block copolymer comprises two A blocks, one B block, and two C blocks in an A-C-B-C-A arrangement.

76. The ion gel of claim 75, wherein the A blocks comprise at least one of polystyrene, poly(N-isopropyl acrylamide), polybutadiene, polyisoprene, polyethylene, polydimethylsiloxane, or polyisobutylene.

77. The ion gel of claim 75, wherein the B block comprises at least one of poly(methylmethacrylate), poly(ethylene oxide), or poly(ethyl acrylate).

78. The ion gel of claim 75, wherein the C blocks comprise polystyrene.

79. The ion gel of claim 34, wherein the A blocks comprise at least one of polystyrene, poly(N-isopropyl acrylamide), polybutadiene, polyisoprene, polyethylene, polydimethylsiloxane, or polyisobutylene.

80. The ion gel of claim 34, wherein the B block comprises at least one of poly(methylmethacrylate), poly(ethylene oxide), or poly(ethyl acrylate).

81. The ion gel of claim 33, wherein the ion gel comprises about 4 wt. % to about 5 wt. % block copolymer.

82. The ion gel of claim 33, wherein the block copolymer has a molecular weight between about 14,000 g/mol and about 140,000 g/mol.

83. The ion gel of claim 82, wherein the block copolymer has a molecular weight between about 30,000 g/mol and about 70,000 g/mol.

* * * * *